(12) United States Patent
Seo

(10) Patent No.: US 11,901,385 B2
(45) Date of Patent: Feb. 13, 2024

(54) SEMICONDUCTOR PACKAGE AND METHOD OF FABRICATING THE SAME

(71) Applicant: SAMSUNG ELECTRONICS CO., LTD., Suwon-si (KR)

(72) Inventor: Byoungrim Seo, Hwaseong-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 316 days.

(21) Appl. No.: 17/351,048

(22) Filed: Jun. 17, 2021

(65) Prior Publication Data
US 2022/0123035 A1 Apr. 21, 2022

(30) Foreign Application Priority Data

Oct. 19, 2020 (KR) .......................... 10-2020-0134921

(51) Int. Cl.
*H01L 27/146* (2006.01)
(52) U.S. Cl.
CPC .... *H01L 27/14618* (2013.01); *H01L 27/1469* (2013.01); *H01L 27/14627* (2013.01); *H01L 27/14634* (2013.01); *H01L 27/14687* (2013.01); *H01L 27/14636* (2013.01)
(58) Field of Classification Search
CPC ......... H01L 27/14618; H01L 27/14627; H01L 27/14634; H01L 27/14687; H01L 27/1469; H01L 27/14636; H01L 25/167; H01L 25/0657; H01L 25/0655; H01L 24/80; H01L 23/13; H01L 23/5386; H01L 23/5389
See application file for complete search history.

(56) References Cited

U.S. PATENT DOCUMENTS

| 8,969,120 B2 | 3/2015 | Huang et al. |
| 9,184,331 B2 | 11/2015 | Chuang et al. |
| 10,290,672 B2 | 5/2019 | Kinsman et al. |
| 10,714,454 B2 | 7/2020 | Hsieh |
| 2003/0151148 A1* | 8/2003 | Camenforte ............ H01L 23/36 257/E23.101 |
| 2006/0043555 A1* | 3/2006 | Liu ................... H01L 27/14634 257/E31.118 |

(Continued)

FOREIGN PATENT DOCUMENTS

| KR | 10-0713347 | 5/2007 |
| KR | 10-2013-0137993 | 12/2013 |

(Continued)

*Primary Examiner* — Sitaramarao S Yechuri
(74) *Attorney, Agent, or Firm* — F. CHAU & ASSOCIATES, LLC

(57) ABSTRACT

A semiconductor package includes a semiconductor chip structure that includes an image sensor chip and a logic chip that contact each other, a transparent substrate disposed on the semiconductor chip structure, and an adhesive structure disposed on an edge of the semiconductor chip structure and between the semiconductor chip structure and the transparent substrate. The adhesive structure includes a first adhesive segment disposed on a top surface of the semiconductor chip structure and a second adhesive segment disposed on a bottom surface of the transparent substrate. The second adhesive segment covers top and lateral surfaces of the first adhesive segment. The image sensor chip is closer to the transparent substrate than the logic chip.

17 Claims, 20 Drawing Sheets

(56) References Cited

U.S. PATENT DOCUMENTS

| | | | |
|---|---|---|---|
| 2006/0098244 A1 | 5/2006 | Choi et al. | |
| 2007/0080470 A1* | 4/2007 | Wehrly | H01L 25/105 |
| | | | 257/E25.023 |
| 2008/0211045 A1* | 9/2008 | Ono | H01L 27/14685 |
| | | | 257/E31.127 |
| 2009/0200630 A1* | 8/2009 | Yamamoto | H01L 27/14683 |
| | | | 257/E31.127 |
| 2010/0148290 A1* | 6/2010 | Park | H01L 27/1464 |
| | | | 257/E31.127 |
| 2016/0148879 A1* | 5/2016 | Saxod | H01L 24/81 |
| | | | 438/118 |
| 2016/0260761 A1* | 9/2016 | Jun | H01L 27/14636 |
| 2020/0135788 A1* | 4/2020 | Chang | H04N 23/55 |

FOREIGN PATENT DOCUMENTS

| | | |
|---|---|---|
| KR | 10-1467699 | 12/2014 |
| KR | 10-2015-0101571 | 9/2015 |

\* cited by examiner

SEMICONDUCTOR PACKAGE AND METHOD OF FABRICATING THE SAME

CROSS-REFERENCE TO RELATED APPLICATION

This U.S. nonprovisional application claims priority under 35 U.S.C § 119 from, and the benefit of, Korean Patent Application No. 10-2020-0134921, filed on Oct. 19, 2020 in the Korean Intellectual Property Office, the contents of which are herein incorporated by reference in their entirety.

TECHNICAL FIELD

Embodiments of the present inventive concepts are directed to a semiconductor package and a method of fabricating the same, and more particularly to, a semiconductor package that includes an image sensor chip and a method of fabricating the same.

DISCUSSION OF RELATED ART

Image sensors, such as CCD sensors or CMOS image sensors, are used in various electronic products, such as mobile phones, digital cameras, optical mice, security cameras, and biometric recognition devices. As electronic products become miniaturized and multi-functional, a semiconductor package that includes an image sensor should have miniaturization/high density, low power consumption, multi-functionality, high-speed signal processing, improved reliability, low price, and sharp image quality. Various studies are being performed to meet such needs.

SUMMARY

Embodiments of the present inventive concepts provide a semiconductor package with improved structural stability and a method of fabricating the same.

Embodiments of the present inventive concepts provide a semiconductor package with increased sensitivity and a method of fabricating the same.

According to some embodiments of the present inventive concepts, a semiconductor package includes: a semiconductor chip structure that includes an image sensor chip and a logic chip that contact each other; a transparent substrate disposed on the semiconductor chip structure; and an adhesive structure disposed on an edge of the semiconductor chip structure and between the semiconductor chip structure and the transparent substrate. The adhesive structure includes: a first adhesive segment disposed on a top surface of the semiconductor chip structure; and a second adhesive segment disposed on a bottom surface of the transparent substrate. The second adhesive segment covers top and lateral surfaces of the first adhesive segment. The image sensor chip is closer to the transparent substrate than the logic chip.

According to some embodiments of the present inventive concepts, a semiconductor package includes: a substrate; a logic chip disposed on the substrate; an image sensor chip disposed on the logic chip, where the image sensor chip includes a microlens array on a top surface of the image senor chip; a transparent substrate disposed on the image sensor chip; and an adhesive structure disposed between the image sensor chip and the transparent substrate, where the adhesive structure surrounds the microlens array. The adhesive structure includes: a first adhesive segment disposed on the top surface of the image sensor chip; a second adhesive segment disposed on the top surface of the image sensor chip, where when viewed in a plan view, the second adhesive segment surrounds the first adhesive segment; and a third adhesive segment disposed on a bottom surface of the transparent substrate, where the third adhesive segment covers the first and second adhesive segments from top sides of the first and second adhesive segments. The first and second adhesive segments include a photo-curable polymer. The third adhesive segment includes a thermo-curable polymer.

According to some embodiments of the present inventive concepts, a method of fabricating a semiconductor package includes: providing a semiconductor chip structure that includes an image sensor chip and a logic chip that contact each other, where the image sensor chip includes a microlens array on a top surface of the image sensor chip; forming a first adhesive segment on a top surface of the semiconductor chip structure, where the first adhesive segment surrounds the microlens array; irradiating the first adhesive segment with light where the first adhesive segment is cured; forming a second adhesive segment on a transparent substrate; placing the transparent substrate on the semiconductor chip structure where the second adhesive segment comes into contact with the first adhesive segment; and heating the second adhesive segment wherein the second adhesive segment is cured. When the transparent substrate is placed on the semiconductor chip structure, the first adhesive segment is inserted into the second adhesive segment.

According to some embodiments of the present inventive concepts, a method of fabricating a semiconductor package includes: forming a first adhesive segment on a top surface of the semiconductor chip structure; forming a third adhesive segment on the top surface of the semiconductor chip structure, where, when viewed in a plan view, the third adhesive segment surrounds the first adhesive segment; irradiating the first adhesive segment and the third adhesive segment with light where the first adhesive segment and the third adhesive segment are cured; forming a second adhesive segment on a transparent substrate; placing the transparent substrate on the semiconductor chip structure where the second adhesive segment comes into contact with the first adhesive segment and the third adhesive segment and the first adhesive segment and the third adhesive segment are inserted into the second adhesive segment; and heating the second adhesive segment where the second adhesive segment is cured.

DETAILED DESCRIPTION

The following will now describe a semiconductor package according to the present inventive concepts with reference to the accompanying drawings.

Figure 1:
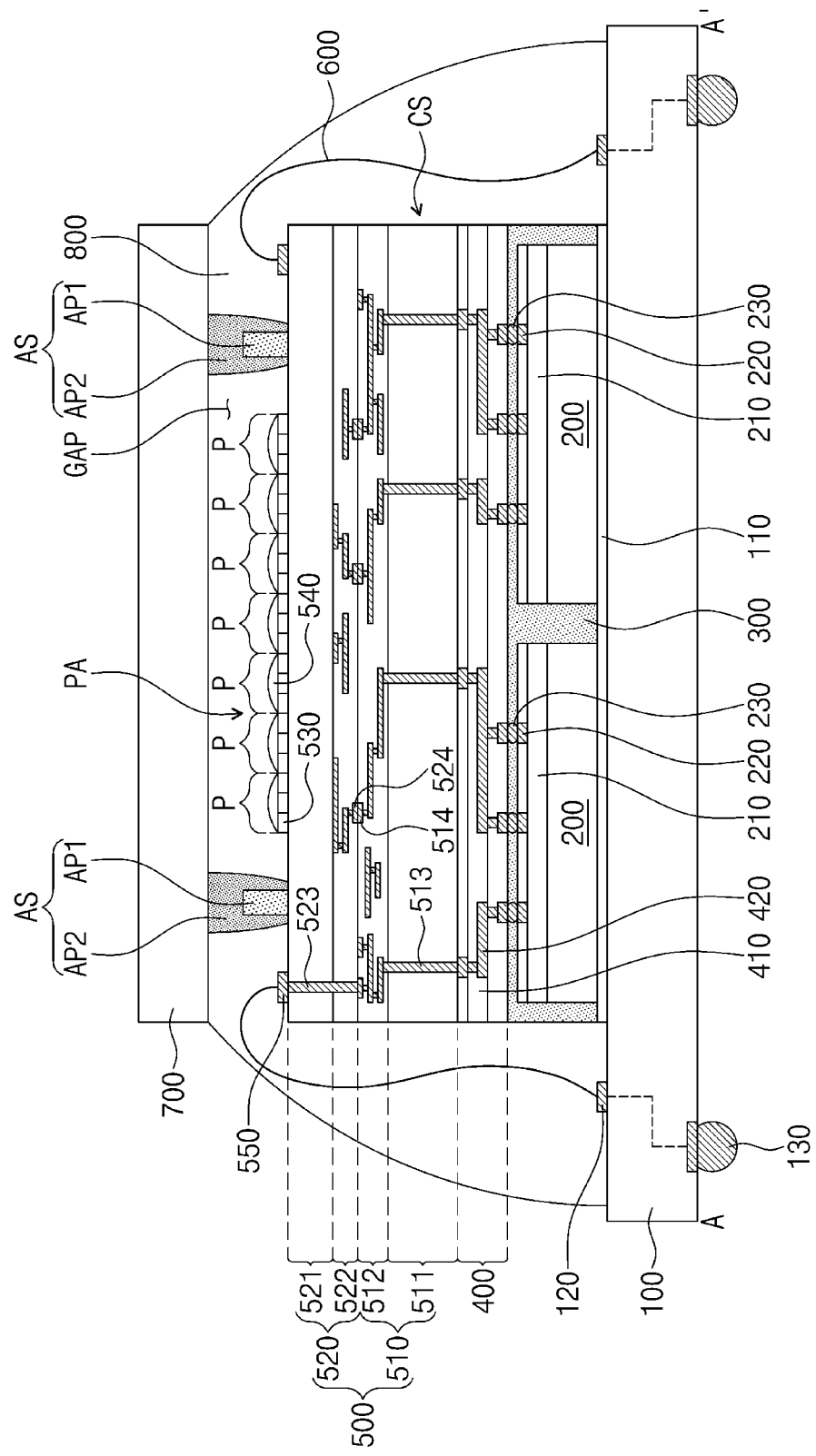
FIG. 1 is a cross-sectional view of a semiconductor package according to some embodiments of the present inventive concepts.
Figure 2:
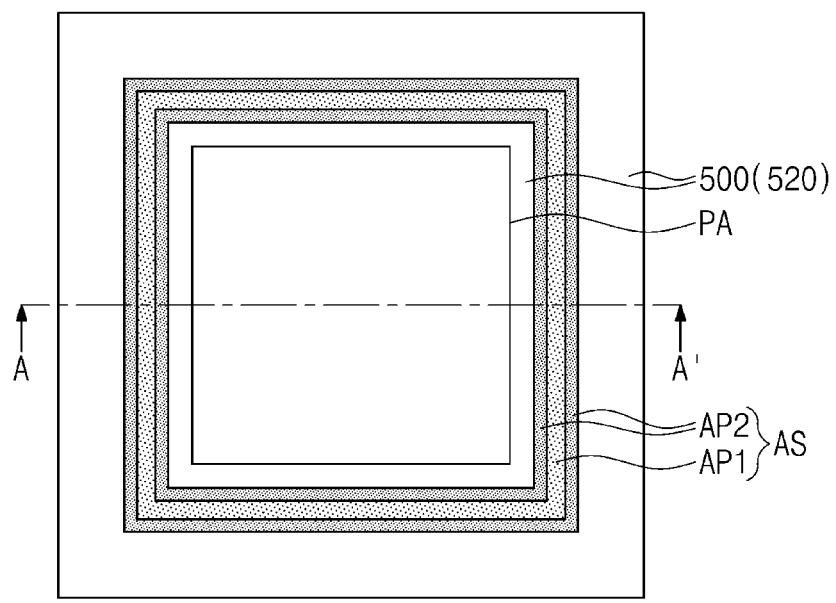
FIG. 2 is a plan view of a semiconductor package according to some embodiments of the present inventive concepts.

FIG. 1 is a cross-sectional view of a semiconductor package according to some embodiments of the present inventive concepts. FIG. 2 is a plan view of a semiconductor package according to some embodiments of the present inventive concepts. The cross section of FIG. 1 is taken along line A-A' of FIG. 2.

Referring to FIGS. 1 and 2, in an embodiment, a substrate 100 is provided. For example, the substrate 100 includes a printed circuit board (PCB). The substrate 100 includes a substrate pad 120 and an external terminal 130. The substrate pad 120 is provided on a top surface of the substrate 100. The external terminal 130 is provided on a bottom surface of the substrate 100. The external terminal 130 has a solder ball shape or a solder bump shape. As indicated by a dotted line, the external terminal 130 is electrically connected through the substrate 100 to the substrate pad 120. In this description, the phrase "electrically connected to" may include a meaning of "directly or indirectly electrically connected to."

In an embodiment, a semiconductor chip structure CS is provided on the substrate 100. The semiconductor chip structure CS includes first semiconductor chips 200, a redistribution layer 400, and an image sensor part 500.

In an embodiment, the first semiconductor chips 200 is a memory chip, such as a dynamic random access memory (DRAM), a static random access memory (SRAM), a magnetic random access memory (MRAM), or a Flash memory. The first semiconductor chips 200 includes silicon. The top surfaces of first semiconductor chips 200 are active surfaces. The first semiconductor chips 200 each include a conductive pattern 210 and a chip pad 220 on an upper portion thereof. The chip pad 220 is electrically connected to an integrated element or circuit in the conductive pattern 210. FIG. 1 depicts two first semiconductor chips 200, but embodiments of the present inventive concepts are not limited thereto. In other embodiments, a single first semiconductor chip 200 may be provided, or more than two first semiconductor chips 200 may be provided.

In an embodiment, the first semiconductor chips 200 are attached to the substrate 100. For example, a substrate adhesive layer 110 is further provided between the substrate 100 and the first semiconductor chips 200.

In an embodiment, a molding layer 300 is provided on the substrate 100. The molding layer 300 covers the first semiconductor chips 200. Lateral surfaces of the first semiconductor chips 200 are not exposed by the molding layer 300. A width of the molding layer 300 is greater than a sum of widths of the first semiconductor chips 200. The molding layer 300 fills a gap between the first semiconductor chips 200. The molding layer 300 does not cover bottom surfaces of the first semiconductor chips 200. The molding layer 300 exposes the chip pads 220 of the first semiconductor chips 200. The molding layer 300 prevents the first semiconductor chips 200 from being damaged due to external impacts, moisture, etc. The molding layer 300 includes a dielectric polymer, such as an epoxy molding compound (EMC).

In an embodiment, the image sensor part 500 is disposed on the molding layer 300. A width of the image sensor part 500 is greater than that of each of the first semiconductor chips 200. The width of the image sensor part 500 is greater than the sum of the widths of the first semiconductor chips 200. When viewed in a plan view, the image sensor part 500 overlaps the first semiconductor chips 200. The image sensor part 500 has a top surface and a bottom surface. The top surface of the image sensor part 500 is a front surface on which light is incident. The bottom surface of the image sensor part 500 faces the first semiconductor chips 200. According to some embodiments, an adhesive layer is provided between the bottom surface of the image sensor part 500 and the first semiconductor chips 200. The bottom surface of the image sensor part 500 is rigidly attached through the adhesive layer to the first semiconductor chips 200. The image sensor part 500 has a lateral surface coplanar with that of the molding layer 300. The image sensor part 500 is supported by the molding layer 300. Therefore, the image sensor part 500 can be stably disposed on the first semiconductor chips 200 and the molding layer 300. The image sensor part 500 detects light incident on the top surface thereof, and then outputs an electrical signal based on the detected light.

In an embodiment, the image sensor part 500 includes a second semiconductor chip 510 and an image sensor chip 520. The image sensor chip 520 includes a photodiode that detects light. The second semiconductor chip 510 includes a logic chip in which light detected by the image sensor chip 520 is converted into an electrical signal.

In an embodiment, the second semiconductor chip 510 is disposed on the molding layer 300. The second semiconductor chip 510 includes a first base layer 511, a first circuit layer 512, a first via 513, and a first bonding pad 514. The first base layer 511 includes a silicon substrate. The first circuit layer 512 is provided on the first base layer 511. The first circuit layer 512 includes an integrated circuit, such as a transistor, and a wiring pattern. The first via 513 penetrates the first base layer 511 and electrically connects the first circuit layer 512 to the first semiconductor chip 200. Therefore, an electrical connection path is provided between the second semiconductor chip 510 and the first semiconductor chip 200. The first bonding pad 514 is disposed on a top surface of the second semiconductor chip 510, and the top surface of the semiconductor chip 510 serves as an active surface. A width of the second semiconductor chip 510 is equal to that of the molding layer 300. The second semiconductor chip 510 has a lateral surface aligned and coplanar with that of the molding layer 300. The lateral surface of the second semiconductor chip 510 is exposed by the molding layer 300. The sum of the widths of the first semiconductor chips 200 is less than the width of the second semiconductor chip 510.

In an embodiment, the image sensor chip 520 is disposed on the second semiconductor chip 510. The image sensor chip 520 includes a second base layer 521, a second circuit layer 522, a second via 523, and a second bonding pad 524. The second base layer 521 includes a silicon substrate. The second circuit layer 522 is disposed on a lower portion of the image sensor chip 520, and is thus be adjacent to the second semiconductor chip 510. The second circuit layer 522 includes a photodiode, an integrated circuit, such as a sensing transistor, and a wiring pattern. The second bonding pad 524 is disposed on a bottom surface of the image sensor chip 520, and the bottom surface of the image sensor chip 520 serves as an active surface. The second bonding pad 524 is in contact with the first bonding pad 514. Therefore, the image sensor chip 520 is electrically connected through the first and second bonding pads 514 and 524 to the second semiconductor chip 510. The second via 523 penetrates at least a portion of the image sensor chip 520. The second via 523 penetrates the image sensor chip 520 to form an electrical connection with the second semiconductor chip 510. Alternatively, the second via 523 penetrates a portion of the image sensor chip 520 to form an electrical connection with the image sensor chip 520. A width of the image sensor chip 520 is equal to that of the second semiconductor chip 510. The image sensor chip 520 has a lateral surface aligned and coplanar with that of the second semiconductor chip 510.

In an embodiment, a pixel array PA is provided on an upper portion of the image sensor part 500. The pixel array PA includes a plurality of pixels P provided on the image sensor chip 520. When viewed in a plan view, the pixels P are located on a central region of the image sensor part 500. The image sensor part 500 has, on its top surface, color filters 530 and microlenses 540 that are provided on corresponding pixels P. The microlenses 540 overlap the first via 513.

In an embodiment, a connection pad 550 is disposed on the top surface of the image sensor part 500. The connection pad 550 is placed on an edge of the top surface of the image sensor part 500. The connection pad 550 is spaced apart from the pixel array PA. The connection pad 550 is electrically connected to the second via 523 of the image sensor chip 520. The connection pad 550 is coupled through a connection wire 600 to the substrate pad 120. The image sensor part 500 is electrically connected through the connection wire 600 to the substrate 100.

According to some embodiments, the redistribution layer 400 is provided between the image sensor part 500 and the first semiconductor chips 200. The redistribution layer 400 extends between the molding layer 300 and the image sensor part 500. When an adhesive layer is provided in some embodiments, the adhesive layer lies between and rigidly attaches the redistribution layer 400 and the first semiconductor chips 200. The redistribution layer 400 includes dielectric layers 410 and a redistribution pattern 420. The redistribution pattern 420 includes a conductive layer and conductive vias. The redistribution layer 400 is electrically connected to the second semiconductor chip 510. The first semiconductor chips 200 are electrically connected through connection terminals 230 to the redistribution layer 400. For example, the connection terminals 230 are provided between the redistribution layer 400 and the first semiconductor chips 200. The connection terminals 230 are provided in the molding layer 300. The redistribution layer 400 increases the freedom of arrangement of the first semiconductor chips 200. Alternatively, in other embodiments, the redistribution layer 400 is omitted, if not necessary. For example, in other embodiments, the first semiconductor chips 200 are directly mounted either on a pad provided on the first via 513 or on the first via 513 exposed on the bottom surface of the second semiconductor chip 510.

In an embodiment, a transparent substrate 700 is provided on the semiconductor chip structure CS. The transparent substrate 700 is adjacent to the top surface of the image sensor chip 520. The transparent substrate 700 may include glass or a transparent polymer material such as acryl.

In an embodiment, an adhesive structure AS is provided between the semiconductor chip structure CS and the transparent substrate 700. As illustrated in FIG. 2, the adhesive structure AS is disposed along an edge of the image sensor chip 520 and forms a closed curve shape. When viewed in a plan view, the adhesive structure AS surrounds the pixel array PA. In particular, the adhesive structure AS surrounds the microlens array 540. The adhesive structure AS is spaced apart from the pixel array PA. The adhesive structure AS is spaced apart from the connection pad 550. The adhesive structure AS is positioned between the connection pad 550 and the pixel array PA. The adhesive structure AS connects a top surface of the image sensor chip 520 to a bottom surface of the transparent substrate 700. The adhesive structure AS allows the transparent substrate 700 and the semiconductor chip structure CS to have an empty space GAP provided therebetween. The adhesive structure AS hermetically seals and separates the empty space GAP from the outside. As such, the empty space GAP is protected from external moisture or contamination.

In an embodiment, adhesive structure AS includes a first adhesive segment AP1 and a second adhesive segment AP2.

In an embodiment, the first adhesive segment AP1 is provided on the top surface of the image sensor chip 520. The first adhesive segment AP1 is attached to the top surface of the image sensor chip 520. The first adhesive segment AP1 has a top surface that is spaced apart from the bottom surface of the transparent substrate 700. Alternatively, the first adhesive segment AP1 may have a top surface in contact with the bottom surface of the transparent substrate 700. As illustrated in FIG. 2, when viewed in a plan view, the first adhesive segment AP1 surrounds the pixel array PA. The first adhesive segment AP1 is disposed along an edge of the image sensor chip 520 and forms a closed curve shape. For example, the first adhesive segment AP1 may have a planar shape of a tetragonal ring. Alternatively, when viewed in a plan view, the first adhesive segment AP1 may have a circular or polygonal ring shape that corresponds to a planar shape of the pixel array PA. The first adhesive segment AP1 has a uniform width t along a height from the top surface of the image sensor chip 520. The width of the first adhesive segment AP1 ranges from about 10 μm to about 150 μm. The first adhesive segment AP1 includes a photo-curable polymer. For example, the first adhesive segment AP1 includes a UV-curable epoxy. The first adhesive segment AP1 may include a transparent or opaque material.

In an embodiment, the second adhesive segment AP2 is provided on the bottom surface of the transparent substrate 700. The second adhesive segment AP2 is attached to the bottom surface of the transparent substrate 700. As illustrated in FIG. 2, when viewed in a plan view, the second adhesive segment AP2 surrounds the pixel array PA. The second adhesive segment AP2 is positioned on the first adhesive segment AP1. The second adhesive segment AP2 overlaps the first adhesive segment AP1. The first adhesive segment AP1 is located inside the second adhesive segment AP2. The second adhesive segment AP2 has a planar shape that corresponds to that of the first adhesive segment AP1. The second adhesive segment AP2 is disposed along an edge of the transparent substrate 700 and forms a closed curve shape. For example, the second adhesive segment AP2 has a planar shape of a tetragonal ring. Alternatively, when viewed in a plan view, the second adhesive segment AP2 may have a circular or polygonal ring shape that corresponds to a planar shape of the pixel array PA. A width of the second adhesive segment AP2 is greater than that of the first adhesive segment AP1. The width of the second adhesive segment AP2 ranges from about 20 μm to about 250 μm. The width of the second adhesive segment AP2 decreases with increasing distance from the bottom surface of the transparent substrate 700. The second adhesive segment AP2 covers the first adhesive segment AP1 from its top side. For example, the second adhesive segment AP2 contacts the top surface of the first adhesive segment AP1. The second adhesive segment AP2 covers lateral surfaces of the first adhesive segment AP1. For example, the second adhesive segment AP2 may cover one or both of the outer and inner lateral surfaces of the first adhesive segment AP1. The second adhesive segment AP2 is attached to the first adhesive segment AP1. As the second adhesive segment AP2 contacts the top and lateral surfaces of the first adhesive segment AP1, the first and second adhesive segments AP1 and AP2 have therebetween a large contact surface and a strong adhesive force. Therefore, the transparent substrate 700 can be firmly adhered to the semiconductor chip structure CS, and a semiconductor package can have improved structural stability. The second adhesive segment AP2 extends along the lateral surfaces of the first adhesive segment AP1 and thus contacts the top surface of the image sensor chip 520. Accordingly, the second adhesive segment AP2 connects the bottom surface of the transparent substrate 700 to the top surface of the image sensor chip 520, and hermetically seals the empty space GAP. The second adhesive segment AP2 includes a thermo-curable polymer. For example, the second adhesive segment AP2 includes a thermo-curable epoxy. The second adhesive segment AP2 includes an opaque material.

When external light is incident on a location other than the transparent substrate 700, such as after passing through the adhesive structure AS, the external light may interfere with light that is incident through the transparent substrate 700, and a semiconductor package may suffer from reduced sensitivity, decreased sensing accuracy, and an increase in noise.

According to embodiments of the present inventive concepts, the opaque second adhesive segment AP2 is used to attach the transparent substrate 700 to the image sensor chip 520, and also to hermetically seal the empty space GAP. Therefore, external light is prevented from passing through the adhesive structure AS into the empty space GAP, and the image sensor chip 520 only receives light that passes through the transparent substrate 700. Thus, a semiconductor package has increased sensitivity and sensing accuracy and reduced noise.

In an embodiment, a protective part 800 is provided on the substrate 100. The protective part 800 is disposed between the substrate 100 and the transparent substrate 700 and covers a lateral surface of the semiconductor chip structure CS. The protective part 800 extends between the semiconductor chip structure CS and the transparent substrate 700 and covers an outer lateral surface of the adhesive structure AS. The protective part 800 externally supports the adhesive structure AS, and can protect the semiconductor chip structure CS and the adhesive structure AS from external impacts. The protective part 800 covers the substrate pad 120 of the substrate 100 and the connection pad 550 of the image sensor chip 520, and buries the connection wire 600. The protective part 800 includes a dielectric material, such as an epoxy molding compound.

Figure 3:
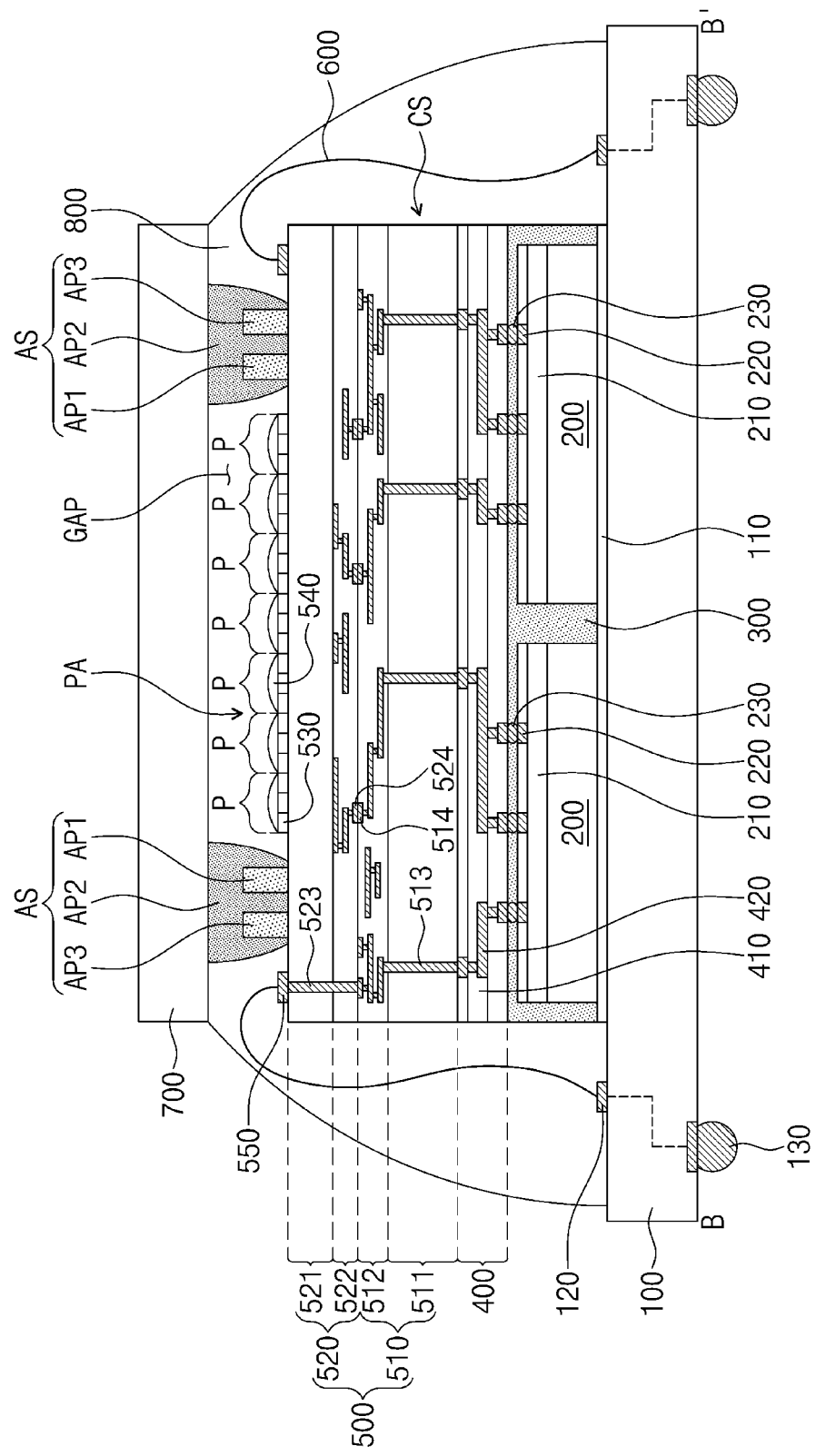
FIG. 3 is a cross-sectional view of a semiconductor package according to some embodiments of the present inventive concepts.
Figure 4:
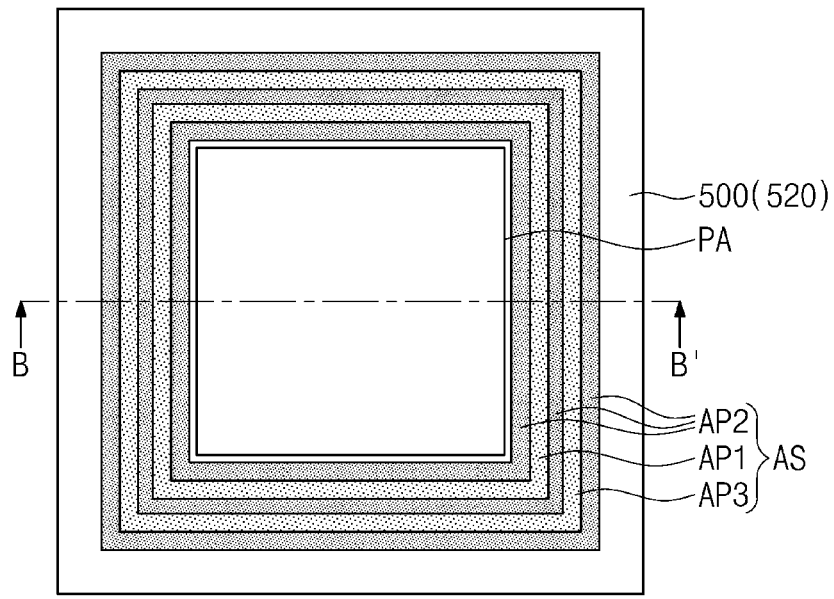
FIGS. 4 and 5 are plan views of a semiconductor package according to some embodiments of the present inventive concepts.
Figure 5:
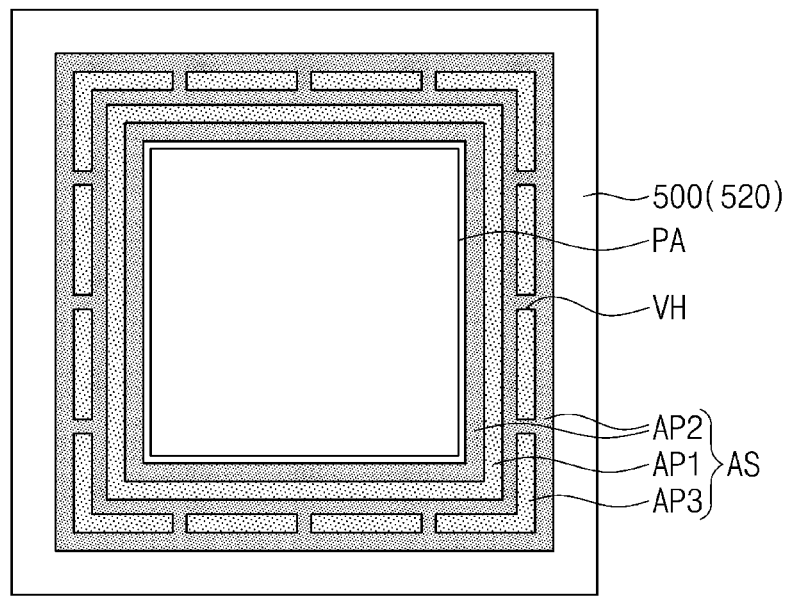

FIG. 3 is a cross-sectional view of a semiconductor package according to some embodiments of the present inventive concepts. FIGS. 4 and 5 are plan views of a semiconductor package according to some embodiments of the present inventive concepts. The cross-sectional view of FIG. 3 is taken along line B-B' of FIG. 4. In an embodiment that follows, a detailed description of technical features described with reference to FIGS. 1 and 2 will be omitted, and differences thereof will be described in detail. The same reference numeral will represent same components of the semiconductor package described above with reference to FIGS. 1 and 2.

Referring to FIGS. 3 and 4, in an embodiment, the adhesive structure AS further includes a third adhesive segment AP3 in addition to the first adhesive segment AP1 and the second adhesive segment AP2.

In an embodiment, the first adhesive segment AP1 is provided on the top surface of the image sensor chip 520. The first adhesive segment AP1 is attached to the top surface of the image sensor chip 520. The first adhesive segment AP1 has a top surface that is spaced apart from the bottom surface of the transparent substrate 700. When viewed in a plan view, the first adhesive segment AP1 surrounds the pixel array PA. The first adhesive segment AP1 is disposed along an edge of the image sensor chip 520 and forms a closed curve shape. The first adhesive segment AP1 includes a photo-curable polymer. The first adhesive segment AP1 may include a transparent or opaque material.

In an embodiment, the third adhesive segment AP3 is provided on the top surface of the image sensor chip 520. The third adhesive segment AP3 is attached to the top surface of the image sensor chip 520. The third adhesive segment AP3 has a top surface that is spaced apart from the bottom surface of the transparent substrate 700. The top surface of the third adhesive segment AP3 is coplanar with the top surface of the first adhesive segment AP1. Alternatively, the third adhesive segment AP3 may have a top surface in contact with the bottom surface of the transparent substrate 700. As illustrated in FIG. 4, when viewed in a plan view, the third adhesive segment AP3 surrounds the pixel array PA. The third adhesive segment AP3 is disposed along an edge of the image sensor chip 520 and forms a closed curve shape. For example, the third adhesive segment AP3 has a planar shape of a tetragonal ring. In addition, when viewed in a plan view, the third adhesive segment AP3 surrounds the first adhesive segment AP1. For example, the first adhesive segment AP1 is positioned inside the third adhesive segment AP3, between the third adhesive segment AP3 and the pixel array PA. The third adhesive segment AP3 is spaced apart from the first adhesive segment AP1. An interval of about 10 µm to about 150 µm is provided between the third adhesive segment AP3 and the first adhesive segment AP1. Alternatively, when viewed in a plan view, the third adhesive segment AP3 may have a circular or polygonal ring shape that corresponds to a planar shape of the first adhesive segment AP1. The third adhesive segment AP3 has a width that is the same as or similar to that of the first adhesive segment AP1. The width of the third adhesive segment AP3 is uniform along a height from the top surface of the image sensor chip 520. The width of the third adhesive segment AP3 ranges from about 10 µm to about 150 µm. The third adhesive segment AP3 includes the same material as that of the first adhesive segment AP1. The third adhesive segment AP3 includes a photo-curable polymer. For example, the third adhesive segment AP3 includes a UV-curable epoxy. The third adhesive segment AP3 may include a transparent or opaque material.

In an embodiment, the second adhesive segment AP2 is provided on the bottom surface of the transparent substrate 700. The second adhesive segment AP2 is attached to the bottom surface of the transparent substrate 700. When viewed in a plan view, the second adhesive segment AP2 surrounds the pixel array PA. The second adhesive segment AP2 is positioned on the first adhesive segment AP and the third adhesive segment AP3. The second adhesive segment AP2 overlaps both of the first and third adhesive segments AP1 and AP3. The first adhesive segment AP1 and the third adhesive segment APs are located inside the second adhesive segment AP2. The second adhesive segment AP2 is disposed along an edge of the transparent substrate 700 and forms a closed curve shape. A width of the second adhesive segment AP2 is greater than that of the first adhesive segment AP1 and that of the third adhesive segment AP3. For example, the width of the second adhesive segment AP2 is greater than a distance between an inner lateral surface of the first adhesive segment AP1 and an outer lateral surface of the third adhesive segment AP3. The width of the second adhesive segment AP2 ranges from about 30 µm to about 500 µm. The width of the second adhesive segment AP2 decreases with increasing distance from the bottom surface of the transparent substrate 700. The second adhesive segment AP2 covers the first and third adhesive segments AP1 and AP3 from their top sides. For example, the second adhesive segment AP2 contacts the top surface of the first adhesive segment AP1 and the top surface of the third adhesive segment AP3. The second adhesive segment AP2 covers lateral surfaces of the first adhesive segment AP1 and lateral surfaces of the third adhesive segment AP3. For example, the second adhesive segment AP2 covers one or both of an inner lateral surface of the first adhesive segment AP1 and an outer lateral surface of the third adhesive segment AP3. The second adhesive segment AP2 fills a gap between the first adhesive segment AP1 and the third adhesive segment AP3. The second adhesive segment AP2 fills a space defined by the first adhesive segment AP1, the third adhesive segment AP3, and the top surface of the image sensor chip 520. The second adhesive segment AP2 is attached to the first adhesive segment AP1 and the third adhesive segment AP3. As the second adhesive segment AP2 contacts the top and lateral surfaces of each of the first and third adhesive segments AP1 and AP3, a large contact surface and a strong adhesive force is provided between the second adhesive segment AP2 and the first and third adhesive segments AP and AP3. Therefore, the transparent substrate 700 can be firmly adhered to the semiconductor chip structure CS, and a semiconductor package has improved structural stability. The second adhesive segment AP2 extends along the lateral surfaces of each of the first and third adhesive segments AP1 and AP3, and thus contacts the top surface of the image sensor chip 520. Accordingly, the second adhesive segment AP2 connects the bottom surface of the transparent substrate 700 to the top surface of the image sensor chip 520, and hermetically seals the empty space GAP. The second adhesive segment AP2 includes a thermo-curable polymer. The second adhesive segment AP2 includes an opaque material.

FIG. 4 depicts that the third adhesive segment AP3 has a planar shape of a closed curve, but embodiments of the present inventive concepts are not limited thereto.

Referring to FIGS. 3 and 5, in an embodiment, the third adhesive segment AP3 has one or more vent holes VH that penetrate the third adhesive segment AP3 and which, when viewed in a plan view, appear as gaps in the third adhesive segment AP3 while extending from inner toward outer lateral surfaces of the third adhesive segment AP3. The vent holes VH connect an inside to an outside of the third adhesive segment AP3. For example, the third adhesive segment AP3 has a plurality of patterns that surround the first adhesive segment AP1.

In an embodiment, the second adhesive segment AP2 covers the first and third adhesive segments AP1 and AP3 from their top sides. For example, the second adhesive segment AP2 contacts the top surface of the first adhesive segment AP1 and the top surface of the third adhesive segment AP3. The second adhesive segment AP2 covers lateral surfaces of the first adhesive segment AP1 and lateral surfaces of the third adhesive segment AP3. The second adhesive segment AP2 fills a gap between the first adhesive segment AP1 and the third adhesive segment AP3. The second adhesive segment AP2 fills a space defined by the first adhesive segment AP1, the third adhesive segment AP3, and the top surface of the image sensor chip 520. In addition, the second adhesive segment AP2 fills the vent holes VH in the third adhesive segment AP3. A large contact surface and a strong adhesive force can be provided between the second adhesive segment AP2 and the first and third adhesive segments AP1 and AP3.

FIGS. 3 to 5 depict that the image sensor chip 520 is provided thereon with two adhesive segments, the first adhesive segment AP1 and the third adhesive segment AP3, but embodiments of the present inventive concepts are not limited thereto. In other embodiments, the image sensor chip 520 may have, on its top surface, adhesive segments that include a plurality of rings offset from each other, and the second adhesive segment AP2 covers all of the adhesive segments on the top surface of the image sensor chip 520. When two or more adhesive segments are formed on the top surface of the image sensor chip 520, a large contact surface and a strong adhesive force can be provided between the second adhesive segment AP2 and the adhesive segments.

FIGS. 6 to 16 are cross-sectional views that illustrate a method of fabricating a semiconductor package according to some embodiments of the present inventive concepts.

Figure 6:
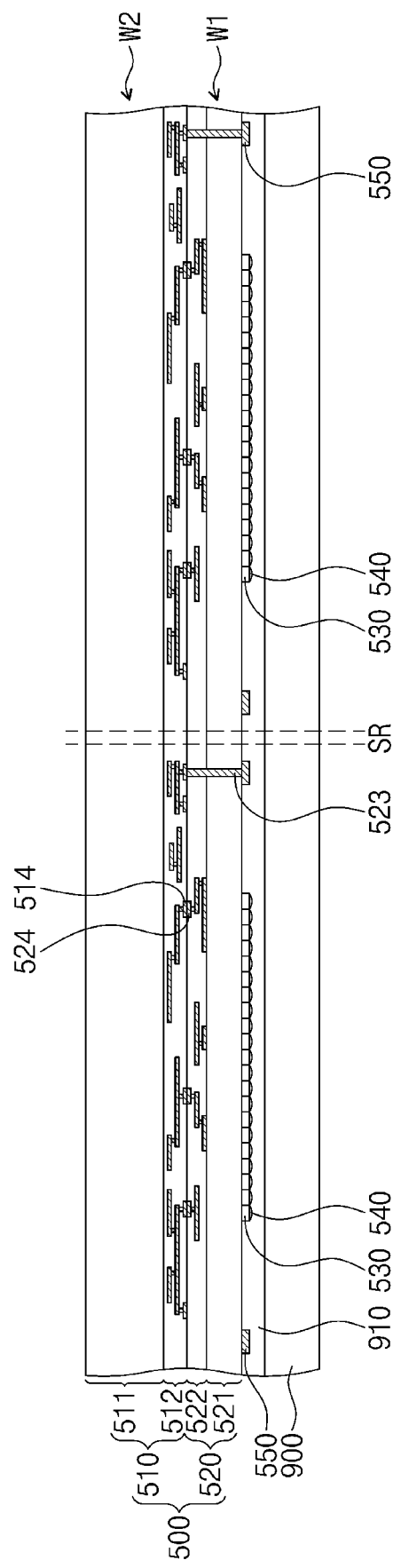
FIGS. 6 to 16 are cross-sectional views that illustrate a method of fabricating a semiconductor package according to some embodiments of the present inventive concepts.

Referring to FIGS. 1 and 6, in an embodiment, a wafer support system (WSS) process is performed to attach a first wafer W1 to a carrier substrate 900. An adhesive means 910 is used to attach the first wafer W1 to the carrier substrate 900. The adhesive means 910 has a structure in which adhesive layers and release layers are alternately stacked. One of the adhesive and release layers includes a material that can be decomposed by heat or ultraviolet radiation. The release layer includes a cross-linking agent whose amount is less than that of a cross-linking agent included in the adhesive layer.

In an embodiment, the first wafer W1 includes image sensor chip sections that are separated by a slice region SR. Each of the image sensor chip sections has the same structure as that of the image sensor chip 520 disclosed in FIG. 1. For example, each image sensor chip section includes a second circuit layer 522 and a second bonding pad 524. Color filters 530 and microlenses 540 are disposed on the image sensor chip sections. The microlenses 540 are contact with and inserted into the adhesive means 910.

In an embodiment, a second wafer W2 is provided that includes logic chip sections that are separated by the slice region SR. The logic chip sections include a first base layer 511, a first circuit layer 512, and a first bonding pad 514, but may exclude the first via 513 of the second semiconductor chip 510 disclosed in FIG. 1.

In an embodiment, a thermo-compression process is performed to bond the first wafer W1 to the second wafer W2 to form a device substrate W1, W2. The second wafer W2 is positioned to allow the image sensor chip sections of the first wafer W1 to overlap the logic chip sections of the second wafer W2. The second circuit layer 522 in the first wafer W1 is positioned to contact the first circuit layer 512 in the second wafer W2. In addition, the second bonding pad 524 in the first wafer W1 is in contact with the first bonding pad 514 in the second wafer W2. The second bonding pad 524 and the first bonding pad 514 are bonded to each other through Cu—Cu hybrid bonding.

Figure 7:
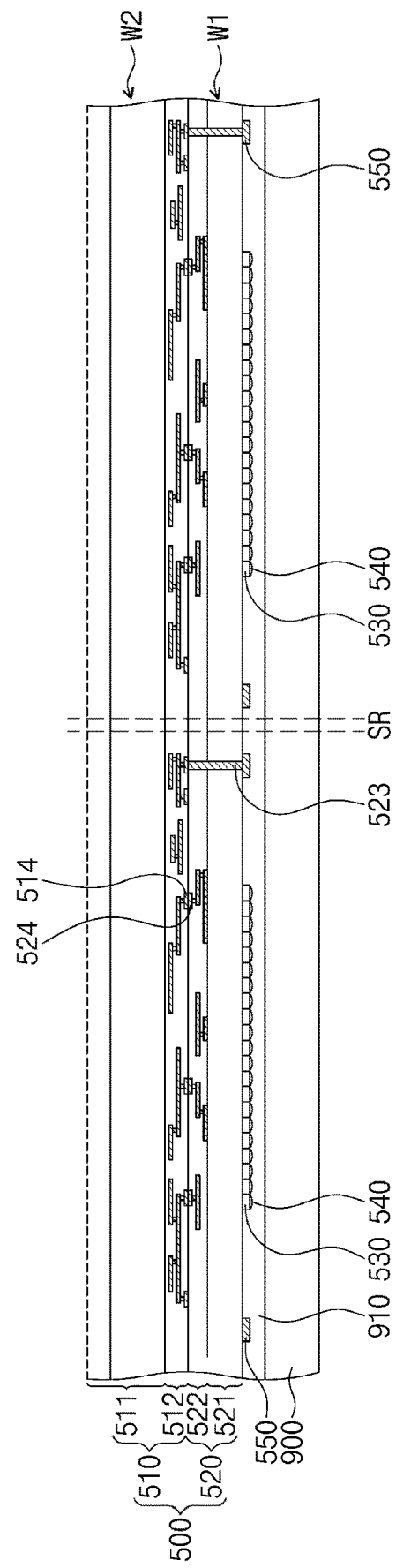

Referring to FIGS. 1 and 7, in an embodiment, a grinding process is performed to reduce a thickness of the second wafer W2. The grinding process remove a portion of the first base layer 511 in the second wafer W2. The grinding process reduces the thickness of the second wafer W2 to be the same as or similar to that of the second wafer W2 shown in FIG. 1.

Figure 8:
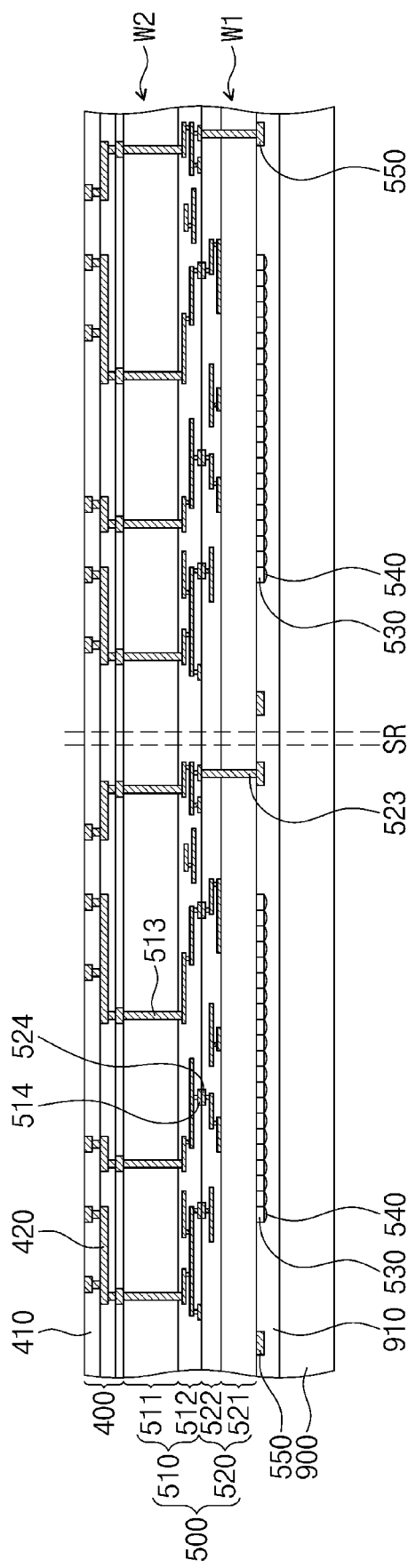

Referring to FIGS. 1 and 8, in an embodiment, a through hole is formed by etching at least a portion of the first base layer 511 in the second wafer W2, and then filling the through hole with a conductive material. Afterwards, the second wafer W2 undergoes a chemical mechanical polishing (CMP) process to form a first via 513.

Optionally, in an embodiment, in the through hole, a via dielectric layer is formed between the first via 513 and the first base layer 511. For example, before filling the through hole with the conductive material, a dielectric material is deposited to conformally cover a top surface of the first base layer 511 and an inner wall of the through hole. After that, the CMP process is performed to pattern the dielectric material to form the via dielectric layer that remains in the through hole.

In an embodiment, a redistribution layer 400 is formed on the second wafer W2. For example, dielectric layers 410 and a redistribution pattern 420 are formed on the second wafer W2. The redistribution pattern 420 is electrically connected to the first via 513. The redistribution pattern 420 has a shape that changes depending on locations on which first semiconductor chips 200 are disposed in a subsequent process.

Figure 9:
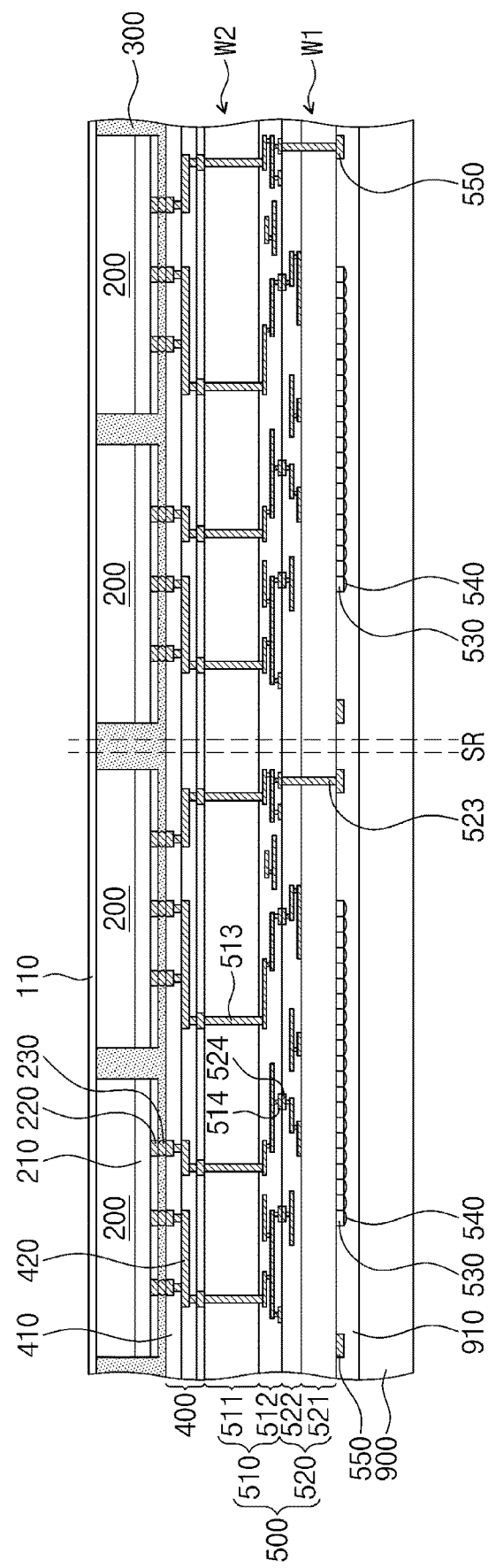

Referring to FIGS. 1 and 9, in an embodiment, first semiconductor chips 200 are mounted on the redistribution layer 400. For example, the first semiconductor chips 200 are provided on a top surface of the redistribution layer 400. Connection terminals 230 are formed between the redistribution layer 400 and the first semiconductor chips 200, and the first semiconductor chips 200 is electrically connected through the connection terminals 230 to an image sensor part 500.

In an embodiment, a molding layer 300 is formed on the redistribution layer 400. The molding layer 300 covers the redistribution layer 400 and lateral surfaces of the first semiconductor chips 200, and surrounds the connection terminals 230. The molding layer 300 does not cover top surfaces of the first semiconductor chips 200.

In an embodiment, a substrate adhesive layer 110 is formed on the molding layer 300. The substrate adhesive layer 110 covers a top surface of the molding layer 300 and the top surfaces of the first semiconductor chips 200.

Figure 10:
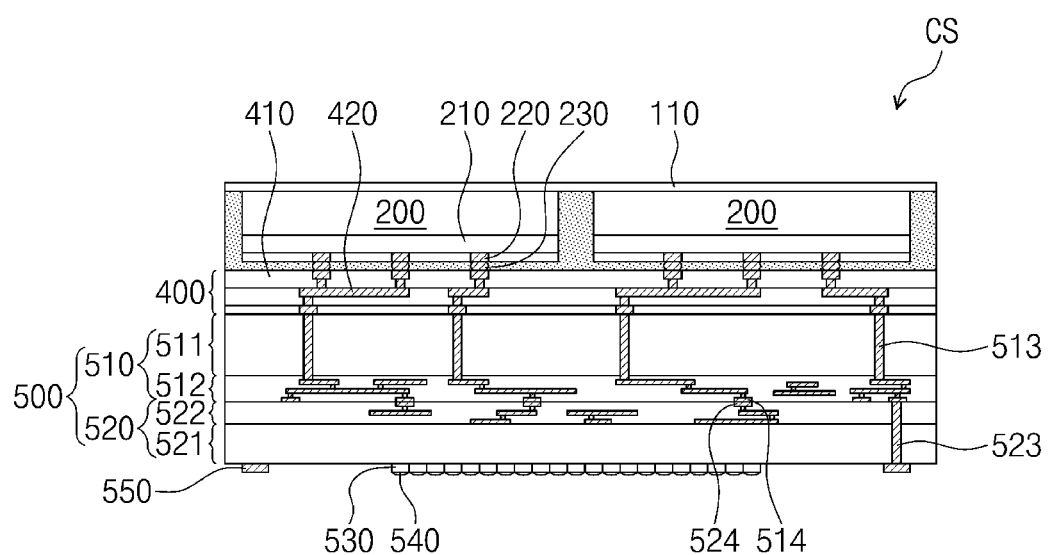

Referring to FIGS. 1 and 10, in an embodiment, a singulation process is performed that slices the device substrate W1, W2. A slice region SR is removed from the device substrate W1, W2 to form semiconductor chip structures CS that are separated from each other. For example, the singulation process can be executed on the molding layer 300 between the first semiconductor chips 200. The singulation process divides the first wafer W1 into image sensor chips 520 and the second wafer W2 into second semiconductor chips 510. Therefore, a lateral surface of the molding layer 300 is coplanar with that of the redistribution layer 400 and that of the image sensor part 500. In addition, the semiconductor chip structures CS undergo a test procedure to remove defective semiconductor chip structures CS.

After that, in an embodiment, the carrier substrate 900 is removed to expose the color filters 530, the microlenses 540, and the connection pads 550. For example, the adhesive means 910 are removed to separate the carrier substrate 900 from the semiconductor chip structures CS.

Figure 11:
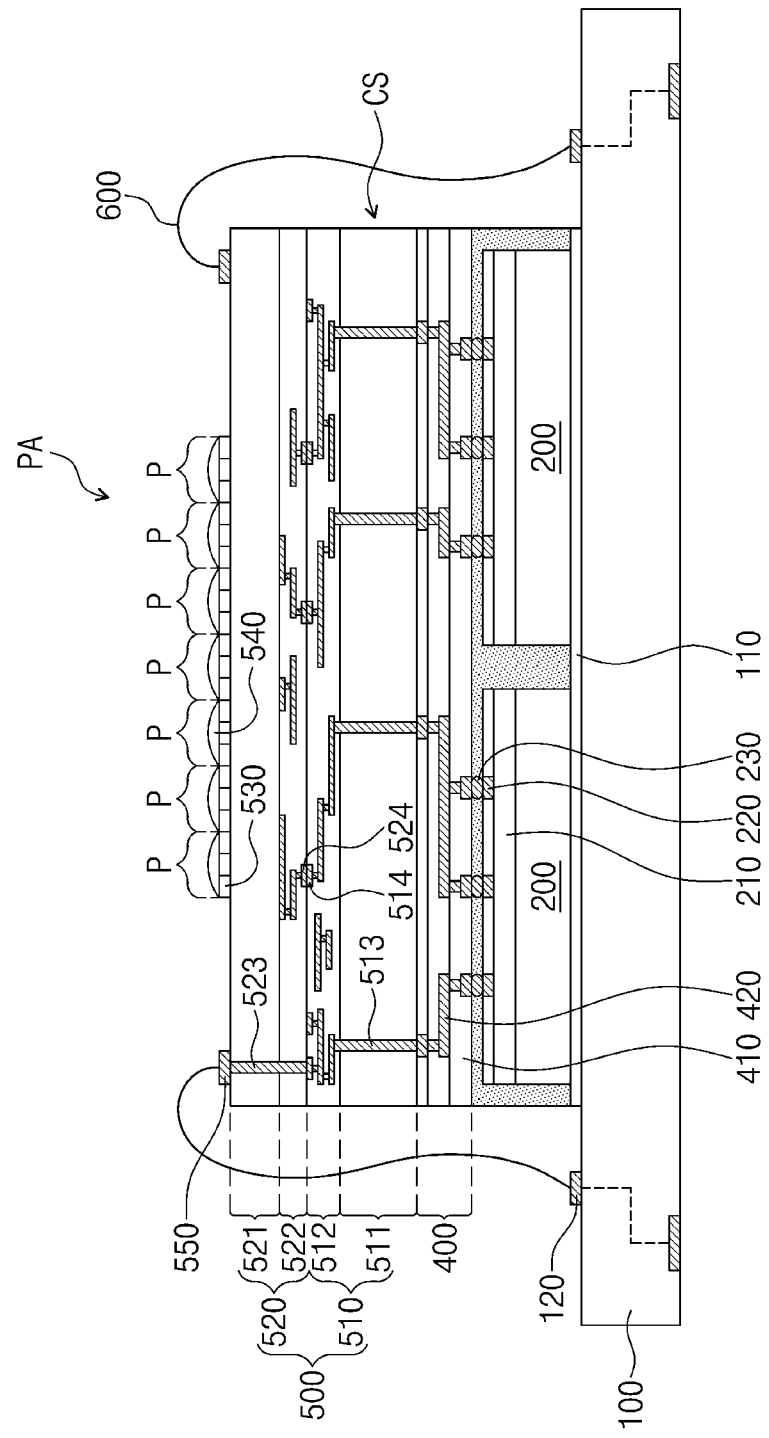

Referring to FIGS. 1 and 11, in an embodiment, the semiconductor chip structure CS is turned upside down, and the semiconductor chip structure CS is disposed on a substrate 100. In this step, bottom surfaces of the first semiconductor chips 200 are directed toward the substrate 100. The semiconductor chip structure CS is attached through a substrate adhesive layer 110 to the substrate 100.

In an embodiment, a connection wire 600 is formed that couples the connection pad 550 and a substrate pad 120.

Figure 12:
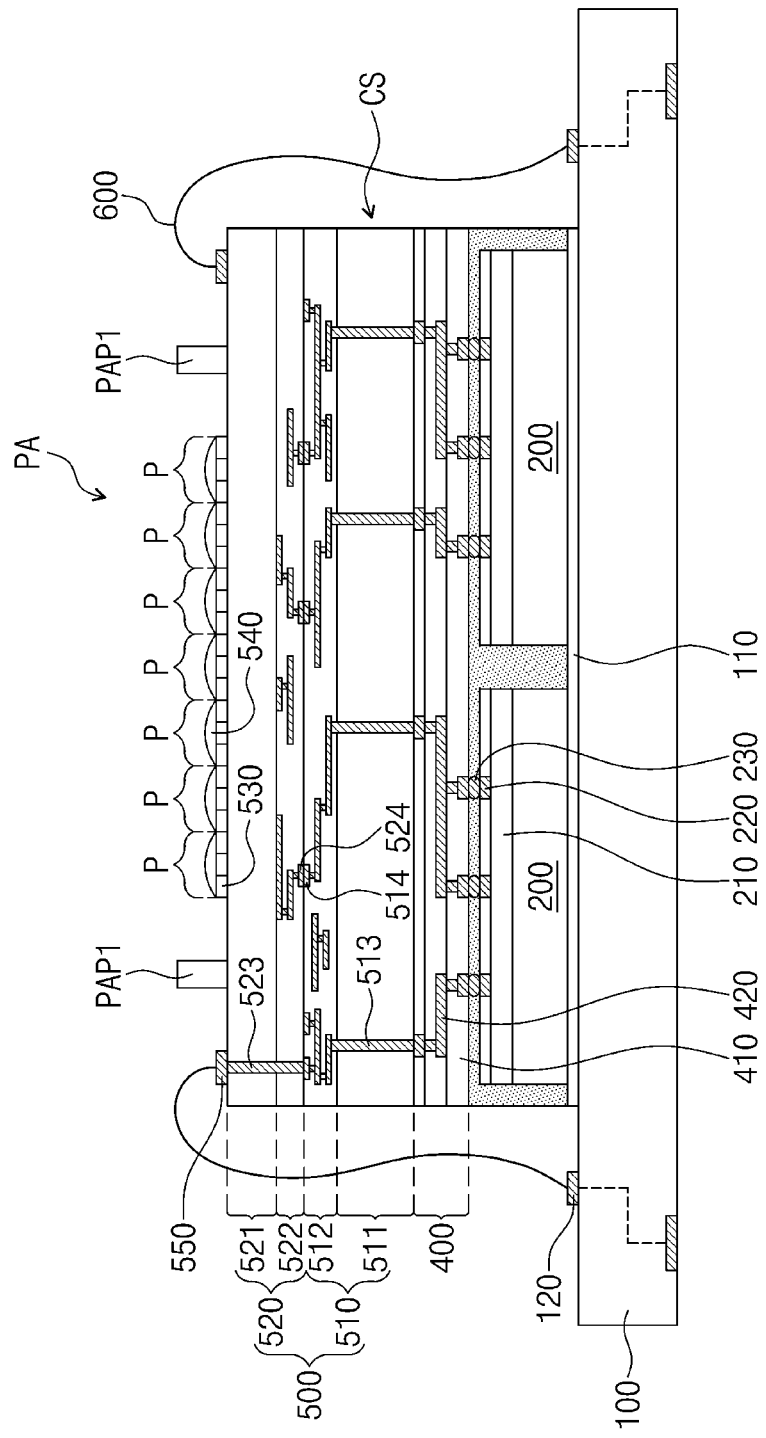

Referring to FIGS. 1 and 12, in an embodiment, a first preliminary adhesive segment PAP1 is formed on the semiconductor chip structure CS. The first preliminary adhesive segment PAP1 is formed on a top surface of the image sensor chip 520. For example, a photo-curable polymer is coated on the top surface of the image sensor chip 520, and then the photo-curable polymer is patterned to form the first preliminary adhesive segment PAP1. The first preliminary adhesive segment PAP1 includes a material that is not yet cured, and thus can be easily patterned. The photo-curable polymer includes an UV-curable epoxy. To optically cure the first preliminary adhesive segment PAP1 in a subsequent process discussed below, the first preliminary adhesive segment PAP1 may be transparent or semitransparent. The first preliminary adhesive segment PAP1 is formed to surround a pixel array PA, when viewed in a plan view. The first preliminary adhesive segment PAP1 is disposed along an edge of the image sensor chip 520 and forms a closed curve shape. The first preliminary adhesive segment PAP1 may be formed to have a uniform width along a height from the top surface of the image sensor chip 520. The width of the first preliminary adhesive segment PAP1 ranges from about 10 μm to about 150 μm.

Figure 13:
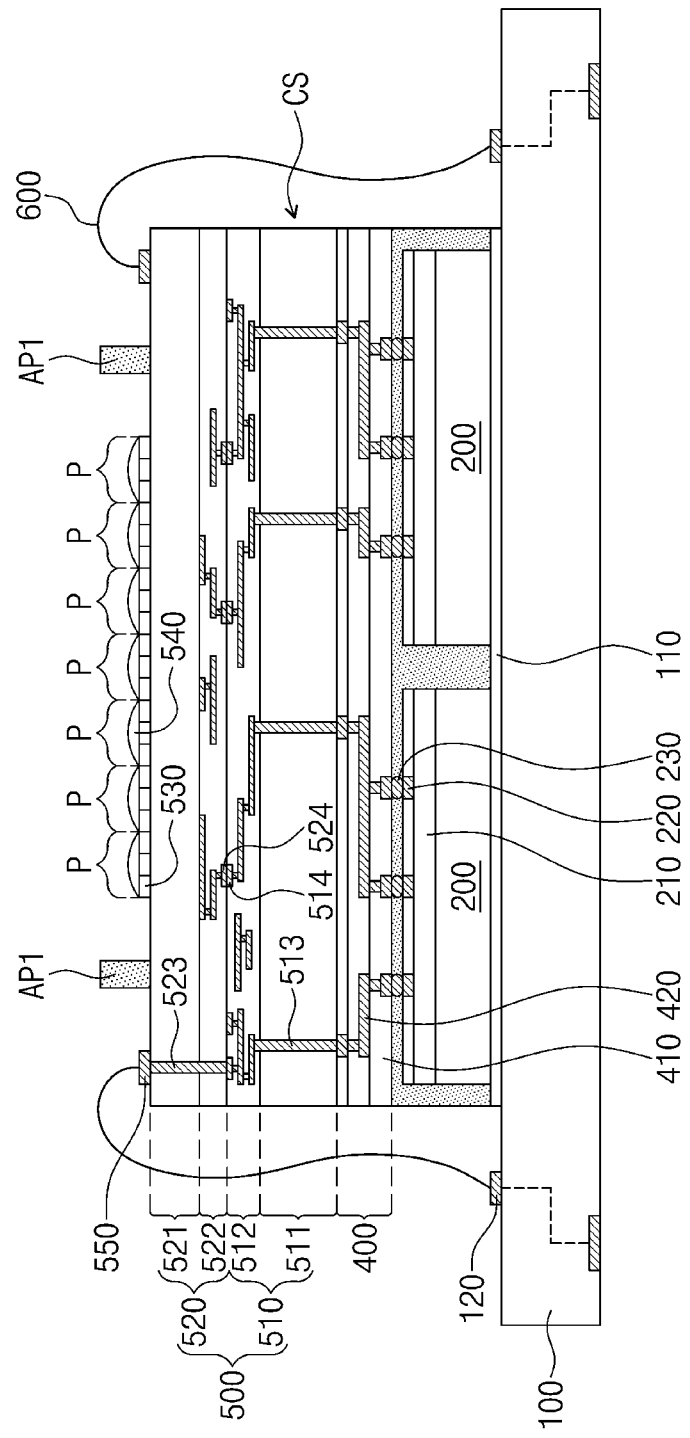

Referring to FIGS. 1 and 13, in an embodiment, the first preliminary adhesive segment PAP1 undergoes a first curing process to form a first adhesive segment AP1. For example, the first curing process includes irradiating the first preliminary adhesive segment PAP1 with ultraviolet radiation (UV) to cure the first preliminary adhesive segment PAP1. The first curing process on the first preliminary adhesive segment PAP1 rigidly attaches the first adhesive segment AP1 to the top surface of the image sensor chip 520, and the first adhesive segment AP1 increases in stiffness.

Figure 14:
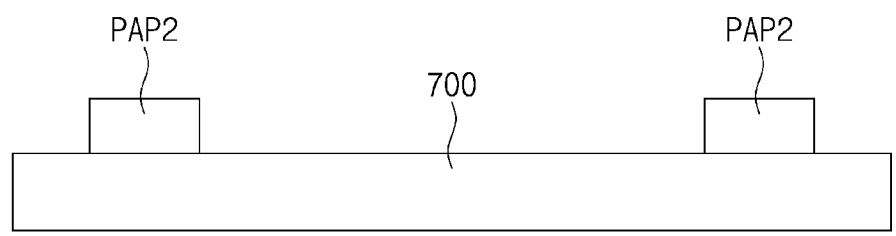

Referring to FIGS. 1 and 14, in an embodiment, a transparent substrate 700 is provided. The transparent substrate 700 may include glass or a transparent polymer material such as acryl.

In an embodiment, a second preliminary adhesive segment PAP2 is formed on one surface of the transparent substrate 700. The second preliminary adhesive segment PAP2 is formed on a top surface of the transparent substrate 700. For example, the second preliminary adhesive segment PAP2 is formed by coating a thermo-curable polymer on the top surface of the transparent substrate 700. The thermo-curable polymer is a thermo-curable epoxy. The second preliminary adhesive segment PAP2 has a closed curve shape.

Figure 15:
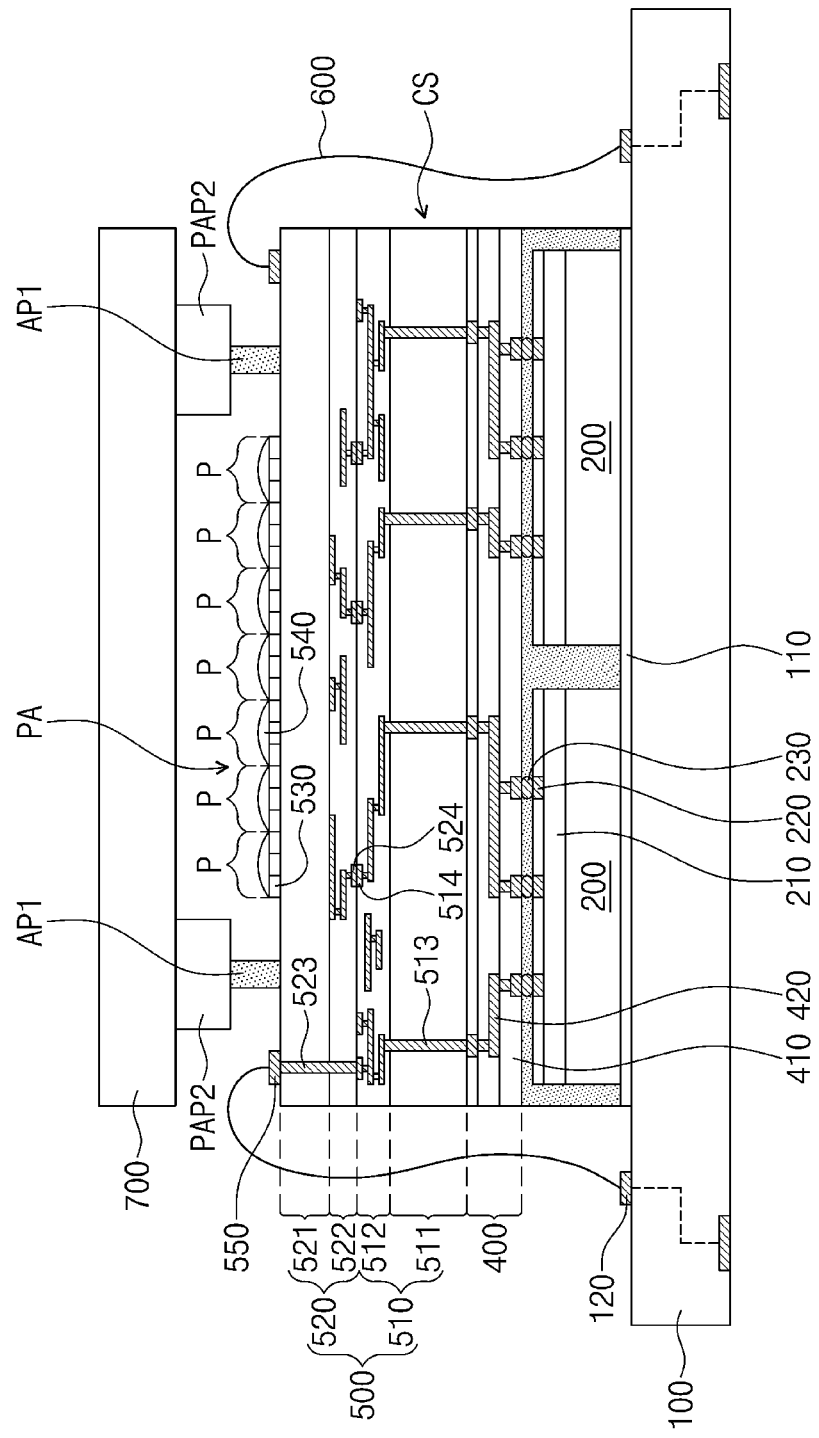

Referring to FIGS. 1 and 15, in an embodiment, the transparent substrate 700 is disposed on the substrate 100. For example, the transparent substrate 700 is placed on the substrate 100 to allow the second preliminary adhesive segment PAP2 to vertically align with the first adhesive segment AP1. Afterwards, the transparent substrate 700 descends to allow the second preliminary adhesive segment PAP2 to contact a top surface of the first adhesive segment AP1.

Figure 16:
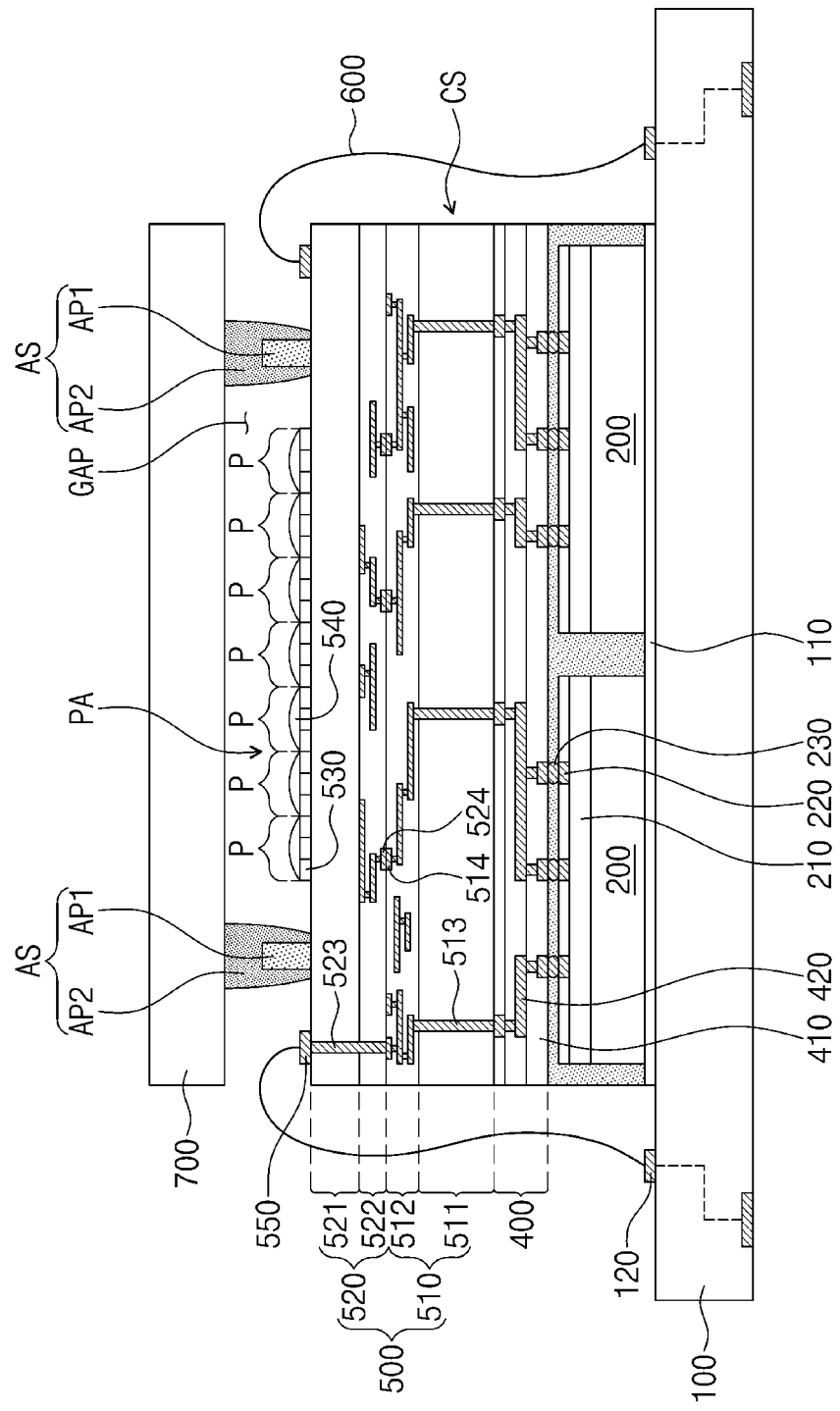

Referring to FIGS. 2 and 16, in an embodiment, the second preliminary adhesive segment PAP2 undergoes a second curing process to form a second adhesive segment AP2. For example, the second curing process includes providing heat to cure the second preliminary adhesive segment PAP2. For example, heat is applied to the second preliminary adhesive segment PAP2. In this step, the second preliminary adhesive segment PAP2 can melt. The melted second preliminary adhesive segment PAP2 flows along lateral surfaces of the first adhesive segment AP1. The melted second preliminary adhesive segment PAP2 covers the lateral surfaces of the first adhesive segment AP1 and contacts the top surface of the image sensor chip 520. The melted second preliminary adhesive segment PAP2 covers the first adhesive segment AP1. For example, the first adhesive segment AP1 is inserted into the second preliminary adhesive segment PAP2. Therefore, the second preliminary adhesive segment PAP2 seals a space between the transparent substrate 700 and the image sensor chip 520. After that, the melted second preliminary adhesive segment PAP2 is cooled down or provided with high-temperature heat to cure a material that constitutes the melted second preliminary adhesive segment PAP2. The second curing process on the second preliminary adhesive segment PAP2 rigidly attaches the second adhesive segment AP2 to the first adhesive segment AP1, and the second adhesive segment AP2 increases in stiffness. The first and second adhesive segments AP1 and AP2 attached to each other form an adhesive structure AS.

According to some embodiments of the present inventive concepts, the second adhesive segment AP2 is attached to all of the top and lateral surfaces of the first adhesive segment AP1, and a strong adhesive force is provided between the second adhesive segment AP2 and the first adhesive segment AP1. Therefore, the transparent substrate 700 is firmly adhered to the semiconductor chip structure CS, and a semiconductor package with improved structural stability can be fabricated.

Moreover, a thermo-curable material can be used to form the second adhesive segment AP2 that seals a space between the transparent substrate 700 and the image sensor chip 520. Heat, not light, is used to cure the second preliminary adhesive segment PAP2, and therefore the second preliminary adhesive segment PAP2 and the second adhesive segment AP2 originating therefrom can be formed from an opaque material. Accordingly, a fabricated semiconductor package can be prevented from receiving light that is incident from a lateral side of the semiconductor package, and the semiconductor package has increased sensitivity and sensing accuracy.

Referring back to FIGS. 1 and 2, in an embodiment, a protective part 800 is formed on the substrate 100. On the substrate 100, the protective part 800 is formed to cover a lateral surface of the semiconductor chip structure CS and to bury the connection wire 600. In this step, the protective part 800 is formed to cover a lateral surface of the adhesive structure AS.

In an embodiment, external terminals 130 are formed on a bottom surface of the substrate 100.

A semiconductor package according to an embodiment can be fabricated as discussed above.

FIGS. 17 to 20 are cross-sectional views that illustrate a method of fabricating a semiconductor package according to some embodiments of the present inventive concepts. FIG. 21 is a plan view that illustrates a method for fabricating a semiconductor package according to some embodiments of the present inventive concepts. The cross-sectional views of FIGS. 17-20 are taken along line C-C' in FIG. 21.

Figure 17:
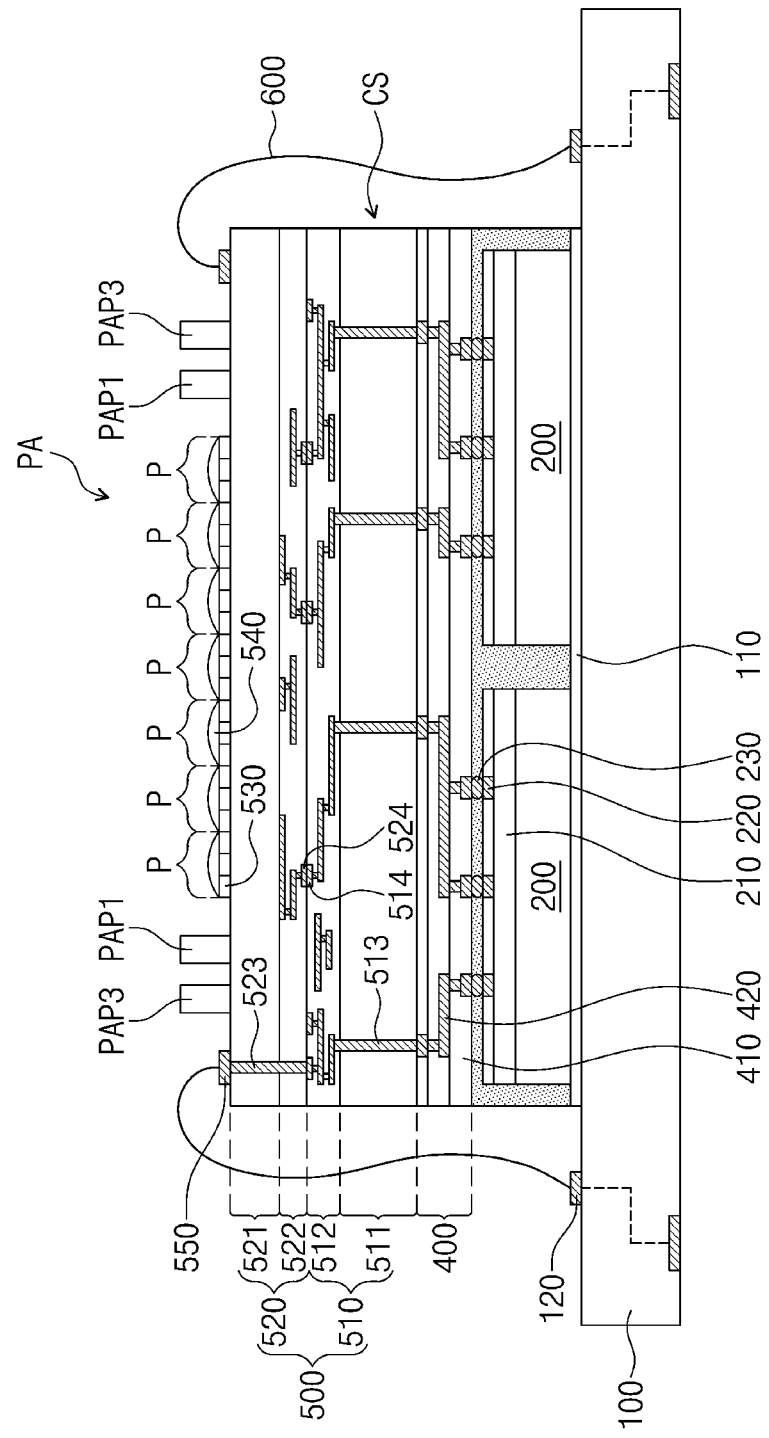
FIGS. 17 to 20 are cross-sectional views that illustrate a method of fabricating a semiconductor package according to some embodiments of the present inventive concepts.

Referring to FIGS. 3 and 17, in an embodiment, a first preliminary adhesive segment PAP1 and a third preliminary adhesive segment PAP3 are formed on the semiconductor chip structure CS of FIG. 11. The first and third preliminary adhesive segments PAP1 and PAP3 are formed on the top surface of the image sensor chip 520. For example, a photo-curable polymer is coated on the top surface of the image sensor chip 520, and then the photo-curable polymer is patterned to form the first and third preliminary adhesive segments PAP1 and PAP3. The photo-curable polymer includes an UV-curable epoxy. The first and third preliminary adhesive segments PAP1 and PAP3 are each disposed along an edge of the image sensor chip 520 and form a closed curve shape. When viewed in a plan view, the first preliminary adhesive segment PAP1 is formed to surround the pixel array PA. When viewed in a plan view, the third preliminary adhesive segment PAP3 is formed to surround the first preliminary adhesive segment PAP1. The third preliminary adhesive segment PAP3 is spaced apart from the first preliminary adhesive segment PAP1.

Figure 18:
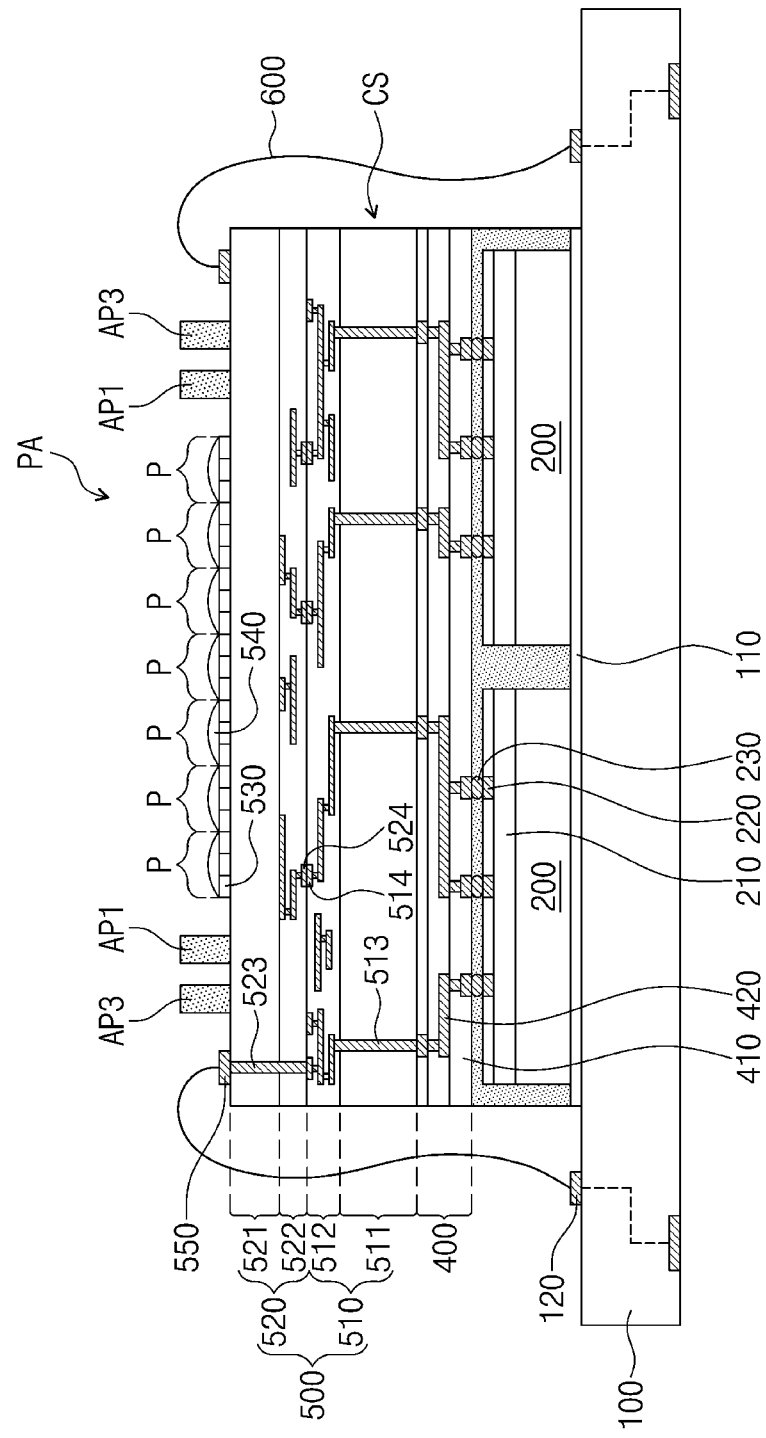

Referring to FIGS. 3 and 18, in an embodiment, the first preliminary adhesive segment PAP1 and the third preliminary adhesive segment PAP3 undergo a first curing process to form a first adhesive segment AP1 and a third adhesive segment AP3. For example, the first curing process includes irradiating the first and third preliminary adhesive segments PAP1 and PAP3 with ultraviolet radiation (UV) to cure the first and third preliminary adhesive segments PAP1 and PAP3. The first curing process rigidly attaches each of the first and third adhesive segments AP1 and AP3 to the top surface of the image sensor chip 520, and the first and third adhesive segments AP1 and AP3 increase in stiffness.

Alternatively, in some embodiments, the third adhesive segment AP3 is formed to have one or more vent holes VH that penetrate the third adhesive segment AP3, as shown in FIG. 5. A photo-curable polymer is coated on the top surface of the image sensor chip 520 as discussed with reference to FIGS. 5 and 17, and the photo-curable polymer is patterned to form the first and third preliminary adhesive segments PAP1 and PAP3. In this step, the third preliminary adhesive segment PAP3 is formed to have a plurality of patterns that surround the first preliminary adhesive segment PAP1. Afterwards, as shown in FIGS. 5 and 18, the first preliminary adhesive segment PAP1 and the third preliminary adhesive segment PAP3 undergo a first curing process to form the first adhesive segment AP1 and the third adhesive segment AP3. The following will discuss an embodiment of FIG. 18.

Figure 19:
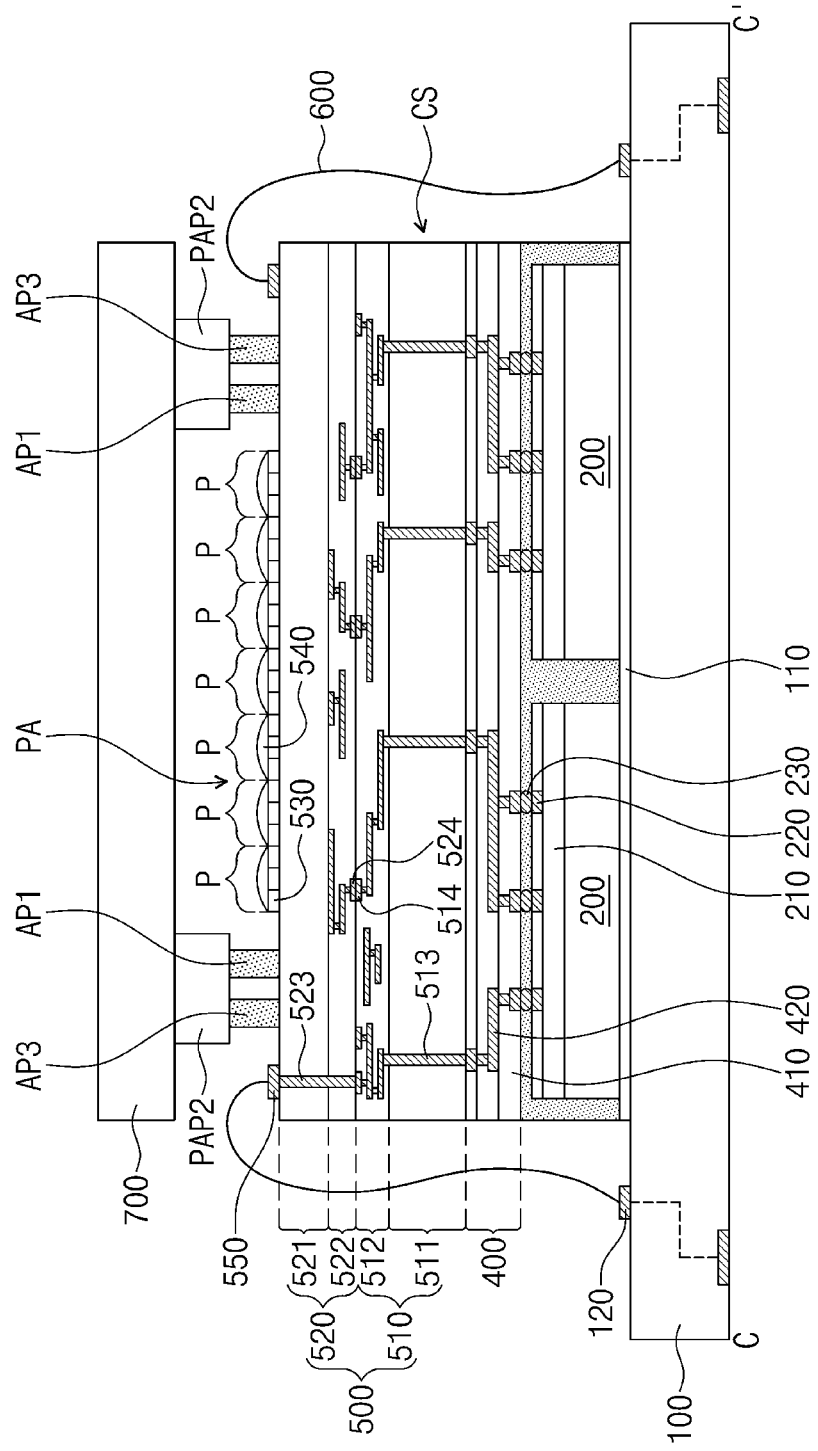

Referring to FIGS. 4 and 19, in an embodiment, a transparent substrate 700 is provided on the substrate 100 as discussed with reference to FIG. 14. For example, the transparent substrate 700 is placed on the substrate 100 to allow the second preliminary adhesive segment PAP2 to vertically align with the first and third adhesive segments AP1 and AP3. In this step, the second adhesive segment AP2 vertically overlaps both of the first and third adhesive segments AP1 and AP3. Afterwards, the transparent substrate 700 descends to allow the second preliminary adhesive segment PAP2 to contact a top surface of the first adhesive segment AP1 and a top surface of the third adhesive segment AP3.

Figure 20:
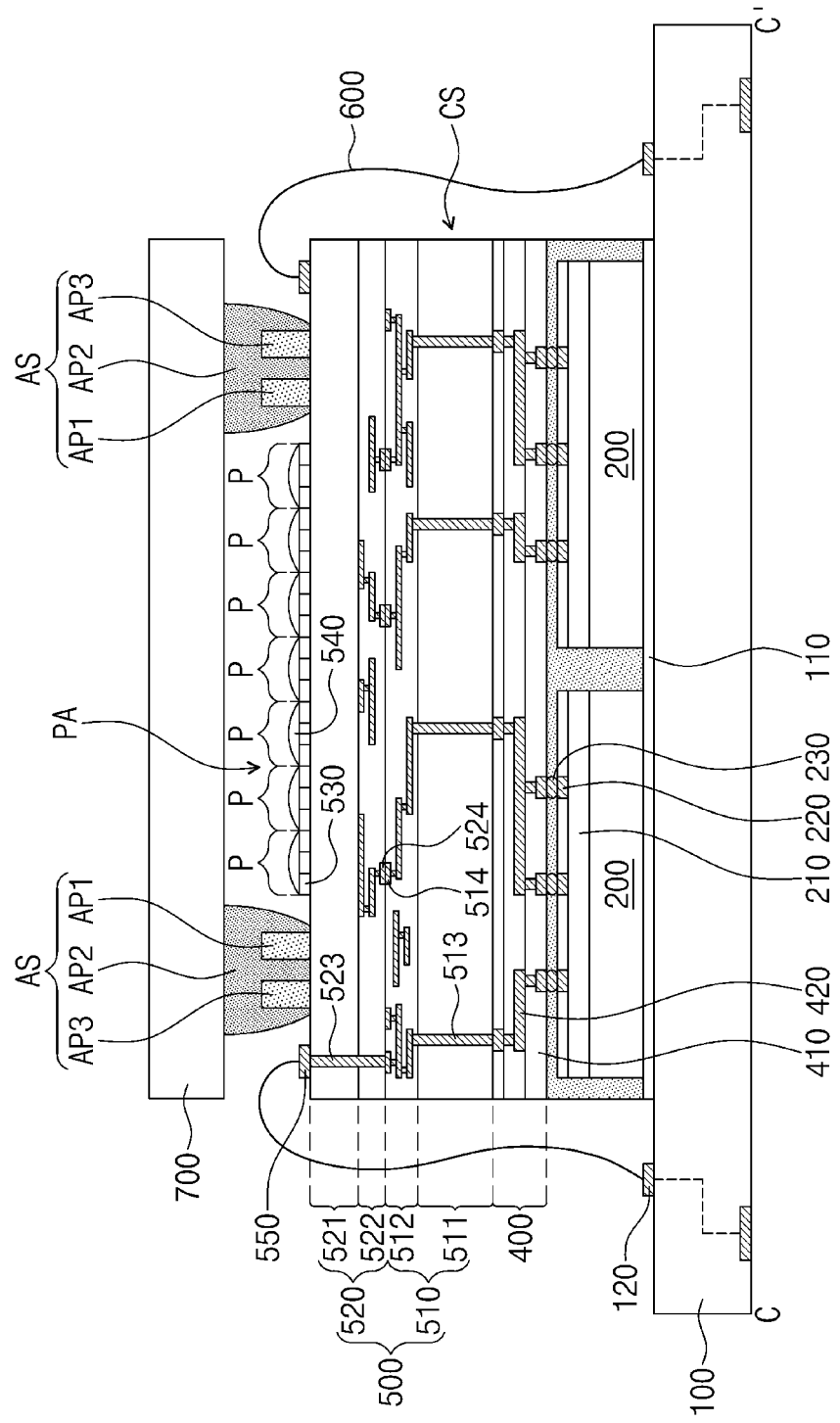
Figure 21:
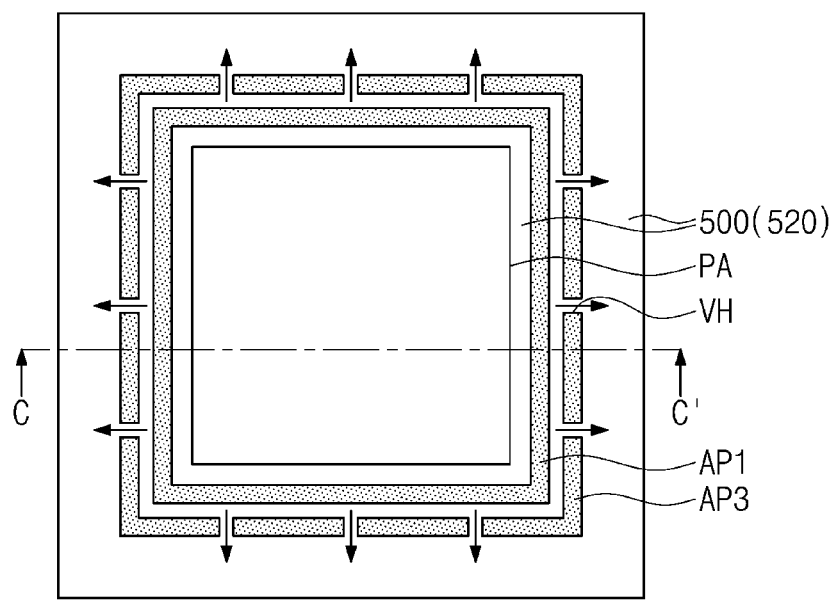
FIG. 21 is a plan view that illustrates a method for fabricating a semiconductor package according to some embodiments of the present inventive concepts.

Referring to FIGS. 4 and 20, in an embodiment, the second preliminary adhesive segment PAP2 undergoes a second curing process to form a second adhesive segment AP2. For example, the second curing process includes heating second preliminary adhesive segment PAP2 to cure the second preliminary adhesive segment PAP2. In more detail, the second preliminary adhesive segment PAP2 is heated to melt the second preliminary adhesive segment PAP2. The melted second preliminary adhesive segment PAP2 flows along lateral surfaces of the first and third adhesive segments AP1 and AP3. The melted second preliminary adhesive segment PAP2 covers the lateral surfaces of the first and third adhesive segments AP1 and AP3, and contacts the top surface of the image sensor chip 520. The melted second preliminary adhesive segment PAP2 fills a space between the first and third adhesive segments AP1 and AP3, and contacts the top surface of the image sensor chip 520 between the first and third adhesive segments AP1 and AP3. For example, the melted second preliminary adhesive segment PAP2 covers the first and third adhesive segments AP1 and AP3. Therefore, the second preliminary adhesive segment PAP2 seals a space between the transparent substrate 700 and the image sensor chip 520. After that, the melted second preliminary adhesive segment PAP2 is cooled down or provided with high-temperature heat to cure a material that forms the melted second preliminary adhesive segment PAP2. The second curing process on the second preliminary adhesive segment PAP2 rigidly attaches the second adhesive segment AP2 to the first adhesive segment AP1 and the third adhesive agent AP3, and the second adhesive segment AP2 increases in stiffness.

In an embodiment, when the third adhesive segment AP3 is formed to have vent holes VH, the melted second preliminary adhesive segment PAP2 fills a space between the first and third adhesive segments AP1 and AP3. In this case, as indicated by arrows in FIG. 21, air is discharged from the space between the first and third adhesive segments AP1 and AP3 through the vent holes V H. Therefore, the occurrence of defects caused by air pressure between the first and third adhesive segments AP1 and AP3 can be reduced.

In a semiconductor package according to some embodiments of the present inventive concepts, as a second adhesive segment is attached to top and lateral surfaces of a first adhesive segment, a large contact surface and a strong adhesive force can be provided between the second adhesive segment and the first adhesive segment. Therefore, a transparent substrate can be firmly adhered to a semiconductor chip structure, and a semiconductor package with improved structural stability can be provided.

An opaque second adhesive segment attaches a transparent substrate to an image sensor chip, and seals an empty space between the transparent substrate and the image sensor chip. Accordingly, external light is prevented from passing through an adhesive structure into the empty space, and the image sensor chip only receives light that passes through the transparent substrate, and the semiconductor package has increased sensitivity and sensing accuracy and reduced noise.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
   a semiconductor chip structure that includes an image sensor chip and a logic chip that contact each other;
   a transparent substrate disposed on the semiconductor chip structure; and
   an adhesive structure disposed on an edge of the semiconductor chip structure and between the semiconductor chip structure and the transparent substrate,
   wherein the adhesive structure includes:
      a first adhesive segment disposed on a top surface of the semiconductor chip structure; and
      a second adhesive segment disposed on a bottom surface of the transparent substrate,
   wherein the second adhesive segment covers top and lateral surfaces of the first adhesive segment,
   wherein the image sensor chip is closer to the transparent substrate than the logic chip, and
   wherein the second adhesive segment is in contact with the top surface of the semiconductor chip structure along the lateral surfaces of the first adhesive segment.

2. The semiconductor package of claim 1, wherein each of the first and second adhesive segments has a planar shape of a closed ring.

3. The semiconductor package of claim 1, wherein the adhesive structure further includes a third adhesive segment disposed on the top surface of the semiconductor chip structure,
   wherein, when viewed in a plan view, the third adhesive segment surrounds the first adhesive segment.

4. The semiconductor package of claim 3, wherein
   the third adhesive segment has a planar shape of a closed ring, and
   when viewed in a plan view, the first adhesive segment is positioned inside the third adhesive segment.

5. The semiconductor package of claim 3, wherein
   the third adhesive segment has a planar ring shape that surrounds the first adhesive segment,
   the third adhesive segment has at least one vent hole that penetrates the third adhesive segment, and
   when viewed in a plan view, the at least one vent hole form gaps in the third adhesive segment, wherein the gaps connect an inside to an outside of the third adhesive segment.

6. The semiconductor package of claim 3, wherein the second adhesive segment covers the top and lateral surfaces of the first adhesive segment and top and lateral surfaces of the third adhesive segment.

7. The semiconductor package of claim 6, wherein the second adhesive segment fills a space surrounded by the first adhesive segment, the third adhesive segment, and the top surface of the semiconductor chip structure.

8. The semiconductor package of claim 1, wherein
   the first adhesive segment includes a photo-curable polymer, and
   the second adhesive segment includes a thermo-curable polymer.

9. A semiconductor package, comprising:
   a substrate;
   a logic chip disposed on the substrate;
   an image sensor chip disposed on the logic chip, wherein the image sensor chip includes a microlens array on a top surface of the image senor chip;
   a transparent substrate disposed on the image sensor chip; and
   an adhesive structure disposed between the image sensor chip and the transparent substrate, wherein the adhesive structure surrounds the microlens array,
   wherein the adhesive structure includes:
      a first adhesive segment disposed on the top surface of the image sensor chip;
      a second adhesive segment disposed on the top surface of the image sensor chip, wherein when viewed in a plan view, the second adhesive segment surrounds the first adhesive segment; and a third adhesive segment disposed on a bottom surface of the transparent substrate, wherein the third adhesive segment covers the first and second adhesive segments from top sides of the first and second adhesive segments, wherein the first and second adhesive segments include a photo-curable polymer, wherein the third adhesive segment includes a thermo-curable polymer, and the third adhesive segment covers top and lateral surfaces of the first adhesive segment and top and lateral surfaces of the second adhesive segment.

10. The semiconductor package of claim 9, wherein the third adhesive segment is in contact with the top surface of the image sensor chip along lateral surfaces of the first adhesive segment or lateral surfaces of the second adhesive segment.

11. The semiconductor package of claim 9, wherein each of the first, second, and third adhesive segments has a planar shape of a closed ring.

12. The semiconductor package of claim 9, wherein each of the first and third adhesive segments has a planar shape of a closed ring, the second adhesive segment has a planar ring shape and at least one vent hole that penetrates the second adhesive segment, and when viewed in a plan view, the at least one vent hole forms a gap in the second adhesive segment, wherein the gap connects an inside to an outside of the second adhesive segment.

13. The semiconductor package of claim 9, wherein the third adhesive segment extends between the first and second adhesive segments and contacts the top surface of the image sensor chip.

14. The semiconductor package of claim 9, wherein the microlens array is positioned in a space between the transparent substrate and the image sensor chip, wherein the space is sealed by the transparent substrate, the image sensor chip, and the third adhesive segment.

15. A method of fabricating a semiconductor package, the method comprising:

providing a semiconductor chip structure that includes an image sensor chip and a logic chip that contact each other, wherein the image sensor chip includes a microlens array on a top surface of the image sensor chip;

forming a first adhesive segment on a top surface of the semiconductor chip structure, wherein the first adhesive segment surrounds the microlens array;

irradiating the first adhesive segment with light wherein the first adhesive segment is cured;

forming a second adhesive segment on a transparent substrate;

placing the transparent substrate on the semiconductor chip structure wherein the second adhesive segment comes into contact with the first adhesive segment; and heating the second adhesive segment wherein the second adhesive segment is cured, wherein, when the transparent substrate is placed on the semiconductor chip structure, the first adhesive segment is inserted into the second adhesive segment, and the second adhesive segment is in contact with the top surface of the semiconductor chip structure.

16. The method of claim 15, wherein the third adhesive segment has at least one vent hole that penetrates the third adhesive segment, and when viewed in a plan view, the at least one vent hole forms a gap in the third adhesive segment, wherein the gap connects an inside to an outside of the third adhesive segment, and when the transparent substrate is placed on the semiconductor chip structure, air between the first and third adhesive segments is externally discharged through the at least one vent hole.

17. The method of claim 15, wherein providing the semiconductor chip structure includes:

attaching a first wafer and a second wafer to each other to form a device substrate, wherein the first wafer includes a plurality of image sensor chip sections, and the second wafer includes a plurality of logic chip sections;

performing a grinding process in which a portion of the second wafer is removed to thin the second wafer; and slicing the device substrate.

* * * * *